US012763141B2

(12) United States Patent
Wu et al.

(10) Patent No.: US 12,763,141 B2
(45) **Date of Patent: *Oct. 13, 2026**

(54) MEMORY DEVICE, INTEGRATED CIRCUIT DEVICE AND METHOD

(71) Applicant: TAIWAN SEMICONDUCTOR MANUFACTURING COMPANY, LTD., Hsinchu (TW)

(72) Inventors: Jui-Jen Wu, Hsinchu (TW); Win-San Khwa, Hsinchu (TW); Jen-Chieh Liu, Hsinchu (TW); Meng-Fan Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 77 days.

This patent is subject to a terminal disclaimer.

(21) Appl. No.: 18/769,120

(22) Filed: Jul. 10, 2024

(65) Prior Publication Data

US 2024/0363159 A1 Oct. 31, 2024

Related U.S. Application Data

(63) Continuation of application No. 17/746,244, filed on May 17, 2022, now Pat. No. 12,080,346.

(51) Int. Cl.

| | |
|---|---|
| ***G11C 16/04*** | (2006.01) |
| ***G11C 5/06*** | (2006.01) |
| ***G11C 13/00*** | (2006.01) |

(52) U.S. Cl.

CPC .......... *G11C 13/0026* (2013.01); *G11C 5/063* (2013.01); *G11C 13/0004* (2013.01); *G11C 13/0028* (2013.01); *G11C 13/0038* (2013.01)

(58) Field of Classification Search

CPC . G11C 13/0026; G11C 5/063; G11C 13/0004; G11C 13/0028; G11C 13/0038

See application file for complete search history.

(56) References Cited

U.S. PATENT DOCUMENTS

| | | | |
|---|---|---|---|
| 7,057,922 | B2 | 6/2006 | Fukumoto |
| 7,260,442 | B2 | 8/2007 | Hwang et al. |
| 7,298,640 | B2 | 11/2007 | Chen et al. |
| 7,542,326 | B2 | 6/2009 | Yoshimura et al. |
| 8,482,969 | B2 | 7/2013 | Hoya et al. |

(Continued)

FOREIGN PATENT DOCUMENTS

| | | |
|---|---|---|
| TW | I409814 | 9/2013 |
| TW | I763952 | 5/2022 |

*Primary Examiner* — Pho M Luu

(74) *Attorney, Agent, or Firm* — Hauptman Ham, LLP

(57) ABSTRACT

A memory device includes a set of word lines, first and second sets of bit lines, a first source line having first and second source line contacts, first and second strings of transistors electrically coupled in parallel between the first and second source line contacts of the source line, and first and second sets of data storage elements. Each word line in the set of word lines is electrically coupled to gates of a transistor in the first string and a corresponding transistor in the second string. The first set of data storage elements is electrically coupled between the first string of transistors and the first set of bit lines. The second set of data storage elements is electrically coupled between the second string of transistors and the second set of bit lines.

20 Claims, 20 Drawing Sheets

(56) References Cited

U.S. PATENT DOCUMENTS

| | | | | |
|---|---|---|---|---|
| 8,587,982 | B2 | 11/2013 | Kim et al. | |
| 8,817,515 | B2 | 8/2014 | Kouno | |
| 9,202,578 | B2 * | 12/2015 | Rhie | G11C 16/0483 |
| 9,256,709 | B2 | 2/2016 | Yu et al. | |
| 9,424,914 | B2 | 8/2016 | Shieh et al. | |
| 9,647,037 | B2 | 5/2017 | Lu et al. | |
| 10,811,092 | B1 | 10/2020 | Lin et al. | |
| 11,037,622 | B2 | 6/2021 | Atsumi et al. | |
| 11,615,299 | B2 | 3/2023 | Mochida et al. | |
| 12,080,346 | B2 * | 9/2024 | Wu | G11C 5/063 |
| 12,094,532 | B2 * | 9/2024 | Shibata | G11C 16/10 |
| 2010/0322008 | A1 * | 12/2010 | Yoneya | G11C 17/165 365/189.011 |
| 2012/0069639 | A1 | 3/2012 | Hoya et al. | |
| 2014/0040838 | A1 | 2/2014 | Liu et al. | |
| 2015/0278429 | A1 | 10/2015 | Chang | |
| 2018/0366186 | A1 | 12/2018 | Han | |

* cited by examiner

MEMORY DEVICE, INTEGRATED CIRCUIT DEVICE AND METHOD

RELATED APPLICATION(S)

The present application is a continuation of U.S. application Ser. No. 17/746,244, filed May 17, 2022, now U.S. Pat. No. 12,080,346, issued Sep. 3, 2024, which is incorporated by reference herein in its entirety.

BACKGROUND

An integrated circuit (IC) device includes a number of semiconductor devices represented in an IC layout diagram. An IC layout diagram is hierarchical and includes modules which carry out higher-level functions in accordance with the semiconductor device design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs. Examples of semiconductor devices and cells correspondingly include memory devices and memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
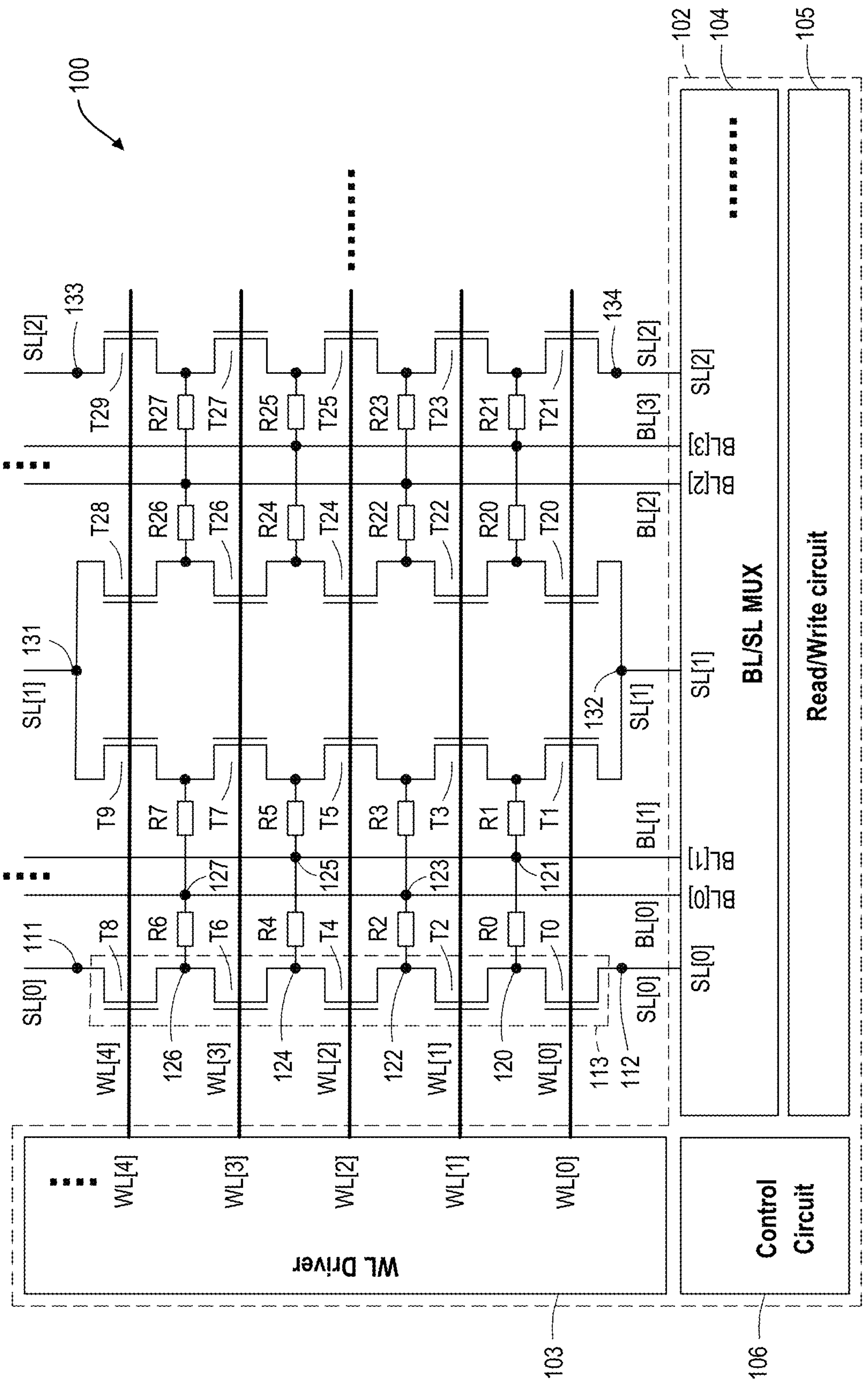
FIG. 1 is a schematic circuit diagram of a memory device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a memory device comprises a string of transistors serially coupled between first and second source line contacts of a source line, and a set of data storage elements. Each data storage element is coupled between a common terminal of a corresponding pair of adjacent transistors and a corresponding bit line in a set of bit lines. In at least one embodiment, adjacent data storage elements are coupled to different bit lines in the set of bit lines. As a result, it is possible in one or more embodiments to form multiple strings of transistors and the corresponding sets of data storage elements in a column over a continuous active region (also referred to as "diffusion region"). This is different from other approaches in which a diffusion region of a pair of 1T1R (1 transistor 1 resistor) memory cells is required to be spaced from a diffusion region of an adjacent pair of 1T1R memory cells. The spacings between adjacent pairs of 1T1R memory cells in the other approaches constitute wasted chip areas. Such spacings and wasted chip areas are advantageously avoidable in one or more embodiments. Other features and advantages are described with respect to various embodiments.

FIG. 1 is a schematic circuit diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises a plurality of data storage elements R0-R7, R20-R27, access transistors T0-T9, T20-T29, and a controller 102 configured to control access to and/or an operation of the data storage elements R0-R7, R20-R27 through one or more of the access transistors T0-T9, T20-T29. The memory device 100 further comprises a plurality of word lines WL[0]-WL[4], a plurality of bit lines BL[0]-BL[3], and a plurality of source lines SL[0]-SL

[2] which couple the controller 102 to the data storage elements R0-R7, R20-R27 and the access transistors T0-T9, T20-T29. The data storage elements R0-R7, R20-R27 are commonly referred to herein as data storage elements R, the access transistors T0-T9, T20-T29 are commonly referred to herein as transistors T, the word lines WL[0]-WL[4] are commonly referred to herein as word lines WL, the bit lines BL[0]-BL[3] are commonly referred to herein as bit lines BL, and the source lines SL[0]-SL[2] are commonly referred to herein as source lines SL. The word lines WL are configured for transmitting addresses of data storage elements R to be read from, and/or to be written to, or the like. The word lines WL are sometimes referred to as “address lines.” The source lines SL and/or the bit lines BL are configured for transmitting data to be written to, and/or read from, the data storage elements R indicated by addresses on the corresponding word lines WL, or the like. The source lines SL and/or the bit lines BL are sometimes referred to as “data lines.” Various numbers of data storage elements R, transistors T, word lines WL, bit lines BL and/or source lines SL in the memory device 100 are within the scope of various embodiments.

In some embodiments, the controller 102 comprises one or more word line drivers 103, one or more source line/bit line multiplexers 104, and one or more read/write circuits 105, which are configured to perform at least one of a read operation or a write operation for one or more of the data storage elements R. A word line driver is coupled to one or more word lines WL and configured to decode a row address of the data storage element R selected to be accessed in a read operation or a write operation. The word line driver is configured to supply a set of voltages to the selected word line(s) WL corresponding to the decoded row address, and a different set of voltages to the other, unselected word lines WL. A source line/bit line multiplexer is coupled to one or more source lines SL and/or one or more bit lines BL. The read/write circuits 105 are coupled to the source line/bit line multiplexers 104, and are configured to decode a column address of the data storage element R to be accessed in a read operation or a write operation. The read/write circuits 105 are configured to supply, through the source line/bit line multiplexers 104, a set of voltages to the selected source line(s) SL and/or selected bit line(s) BL corresponding to the selected data storage element R to be accessed, and a different set of voltages to the other, unselected source lines SL and unselected bit lines BL. For example, in a write operation (also referred to as “programming operation”), the read/write circuits 105 and source line/bit line multiplexers 104 are configured to supply a write voltage (also referred to as “program voltage”) across the selected data storage element R. In a read operation, the read/write circuits 105 and source line/bit line multiplexers 104 are configured to supply a read voltage across the selected data storage element R. In a read operation, one or more sense amplifiers of the read/write circuits 105 are configured to sense data read from the accessed data storage element R and retrieved through the corresponding bit line(s) and/or source line(s). The controller 102 further includes a control circuit 106 configured to control operations of the word line drivers 103, source line/bit line multiplexers 104, read/write circuits 105 and/or other components in the controller 102. In at least one embodiment, the controller 102 further includes one or more clock generators for providing clock signals for various components of the memory device 100, one or more input/output (I/O) circuits for data exchange with external devices, and/or one or more sub-controllers for controlling various operations in the memory device 100. The described memory device configuration is an example, and other memory device configurations are within the scopes of various embodiments.

In at least one embodiment, the memory device 100 is a non-volatile memory. In at least one embodiment, the memory device 100 is a non-volatile, reprogrammable memory. Examples of memory types applicable to the memory device 100 include, but are not limited to, resistive random access memory (RRAM), magneto-resistive random access memory (MRAM), phase-change random access memory (PCRAM), or the like. Other types of memory are within the scopes of various embodiments. The data storage elements R are configured corresponding to the memory type of the memory device 100. In one or more embodiments, the data storage elements R comprise RRAM elements, MRAM elements, PCRAM elements, or the like. In one or more embodiments, a data storage element R comprises a pair of electrodes, and a data storage material sandwiched between the pair of electrodes. The data storage material has a property, e.g., resistance, that changes depending on a program voltage applied across the pair of electrodes. The changed property indicates a datum stored in the data storage element R. The stored datum is read by applying a read voltage across the pair of electrodes and detecting a current flowing through the data storage element R. In some embodiments described herein, data storage elements R comprise RRAM elements.

Examples of transistors T include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In the example configuration in FIG. 1, all access transistors are N-type, N-channel or NMOS transistors. Other configurations are within the scopes of various embodiments.

In FIG. 1, the memory device 100 comprises four sets of transistors, each set coupled with and configured for accessing a corresponding set of data storage elements. A first set of transistors includes transistors T0, T2, T4, T6, T8 which are coupled with and configured for accessing a corresponding first set of data storage elements R0, R2, R4, R6. A second set of transistors includes transistors T1, T3, T5, T7, T9 which are coupled with and configured for accessing a corresponding second set of data storage elements R1, R3, R5, R7. A third set of transistors includes transistors T20, T22, T24, T26, T28 which are coupled with and configured for accessing a corresponding third set of data storage elements R20, R22, R24, R26. A fourth set of transistors includes transistors T21, T23, T25, T27, T29 which are coupled with and configured for accessing a corresponding fourth set of data storage elements R21, R23, R25, R27. Each set of transistors and the corresponding set of data storage elements are coupled to corresponding word lines WL, bit lines BL and source line SL in a similar manner, as described in detail herein with respect to the first set of transistors T0, T2, T4, T6, T8 and the first set of data storage elements R0, R2, R4, R6.

The first set of transistors T0, T2, T4, T6, T8 and the first set of data storage elements R0, R2, R4, R6 are coupled to the corresponding set of word lines WL[0]-WL[4], the corresponding set of bit lines BL[0]-BL[1], and the corresponding source line SL[0]. The source line SL[0] has first and second source line contacts 111, 112. The transistors T0, T2, T4, T6, T8 are serially coupled between the source line contacts 111, 112 to form a string of transistors 113. The transistors T0, T2, T4, T6, T8 in the string of transistors 113 have gates correspondingly coupled to the word lines WL[0]-WL[4]. Each pair of adjacent transistors in the string of transistors 113 has a common terminal, e.g., a common source/drain. For example, adjacent transistors T0, T2 have a common terminal 120, adjacent transistors T2, T4 have a common terminal 122, adjacent transistors T4, T6 have a common terminal 124, and adjacent transistors T6, T8 have a common terminal 126.

Each of the data storage elements R0, R2, R4, R6 is coupled between a common terminal of a corresponding pair of adjacent transistors in the set of transistors, and a corresponding bit line in the set of bit lines. For example, the data storage element R0 has a first end coupled to the common terminal 120 of the adjacent transistors T0, T2, and this first end is also designated by the same reference numeral "120." The data storage element R0 further has a second end 121 coupled to the bit line BL[1]. The data storage element R2 has a first end coupled to the common terminal 122 of the adjacent transistors T2, T4, and this first end is also designated by the same reference numeral "122." The data storage element R2 further has a second end 123 coupled to the bit line BL[0]. The data storage element R4 has a first end coupled to the common terminal 124 of the adjacent transistors T4, T6, and this first end is also designated by the same reference numeral "124." The data storage element R4 further has a second end 125 coupled to the bit line BL[1]. The data storage element R6 has a first end coupled to the common terminal 126 of the adjacent transistors T6, T8, and this first end is also designated by the same reference numeral "126." The data storage element R2 further has a second end 127 coupled to the bit line BL[0]. Thus, a pair of adjacent data storage elements in the set of data storage elements R0, R2, R4, R6 is coupled to different bit lines in the set of bit lines BL[0], BL[1]. In other words, in the set of data storage elements R0, R2, R4, R6, data storage elements R0, R4 coupled to the bit line BL[1] and data storage elements R2, R6 coupled to the bit line BL[0] are arranged alternatingly along the string of transistors 113. The described connections of the set of data storage elements R0, R2, R4, R6 are examples. Other configurations are within the scopes of various embodiments. For example, in at least one embodiment, data storage elements R0, R4 are coupled to the bit line BL[0] and data storage elements R2, R6 are coupled to the bit line BL[1]. In one or more embodiments, data storage elements R0, R2 are correspondingly coupled to the bit lines BL[1], BL[0] as described with respect to FIG. 1; however, data storage elements R4, R6 are correspondingly coupled to the bit lines BL[0], BL[1].

The second set of transistors T1, T3, T5, T7, T9 and the second set of data storage elements R1, R3, R5, R7 are coupled to the corresponding set of word lines WL[0]-WL[4], the corresponding set of bit lines BL[0]-BL[1], and the corresponding source line SL[1]. The source line SL[1] has first and second source line contacts 131, 132. The transistors T1, T3, T5, T7, T9 are serially coupled between the source line contacts 131, 132 to form a string of transistors. The transistors T1, T3, T5, T7, T9 have gates correspondingly coupled to the word lines WL[0]-WL[4]. Each pair of adjacent transistors among the transistors T1, T3, T5, T7, T9 has a common terminal, e.g., a common source/drain. Each of the data storage elements R1, R3, R5, R7 is coupled between a common terminal of a corresponding pair of adjacent transistors in the set of transistors, and a corresponding bit line in the set of bit lines. For example, the data storage element R1 is coupled between a common terminal of the adjacent transistors T1, T3, and the bit line BL[1]. The data storage element R3 is coupled between a common terminal of the adjacent transistors T3, T5, and the bit line BL[0]. The data storage element R5 is coupled between a common terminal of the adjacent transistors T5, T7, and the bit line BL[1]. The data storage element R7 is coupled between a common terminal of the adjacent transistors T7, T9, and the bit line BL[0].

The third set of transistors T20, T22, T24, T26, T28 and the third set of data storage elements R20, R22, R24, R26 are coupled to the corresponding set of word lines WL[0]-WL[4], the corresponding set of bit lines BL[2]-BL[3], and the corresponding source line SL[1] in a manner similar to the described connections in which the first set of transistors T0, T2, T4, T6, T8 and the first set of data storage elements R0, R2, R4, R6 are coupled to the corresponding set of word lines WL[0]-WL[4], the corresponding set of bit lines BL[0]-BL[1], and the corresponding source line SL[0].

The fourth set of transistors T21, T23, T25, T27, T29 and the fourth set of data storage elements R21, R23, R25, R27 are coupled to the corresponding set of word lines WL[0]-WL[4], the corresponding set of bit lines BL[2]-BL[3], and the corresponding source line SL[2] having first and second source line contacts 133, 134 in a manner similar to the described connections in which the second set of transistors T1, T3, T5, T7, T9 and the second set of data storage elements R1, R3, R5, R7 are coupled to the corresponding set of word lines WL[0]-WL[4], the corresponding set of bit lines BL[0]-BL[1], and the corresponding source line SL[1].

Figure 2A:
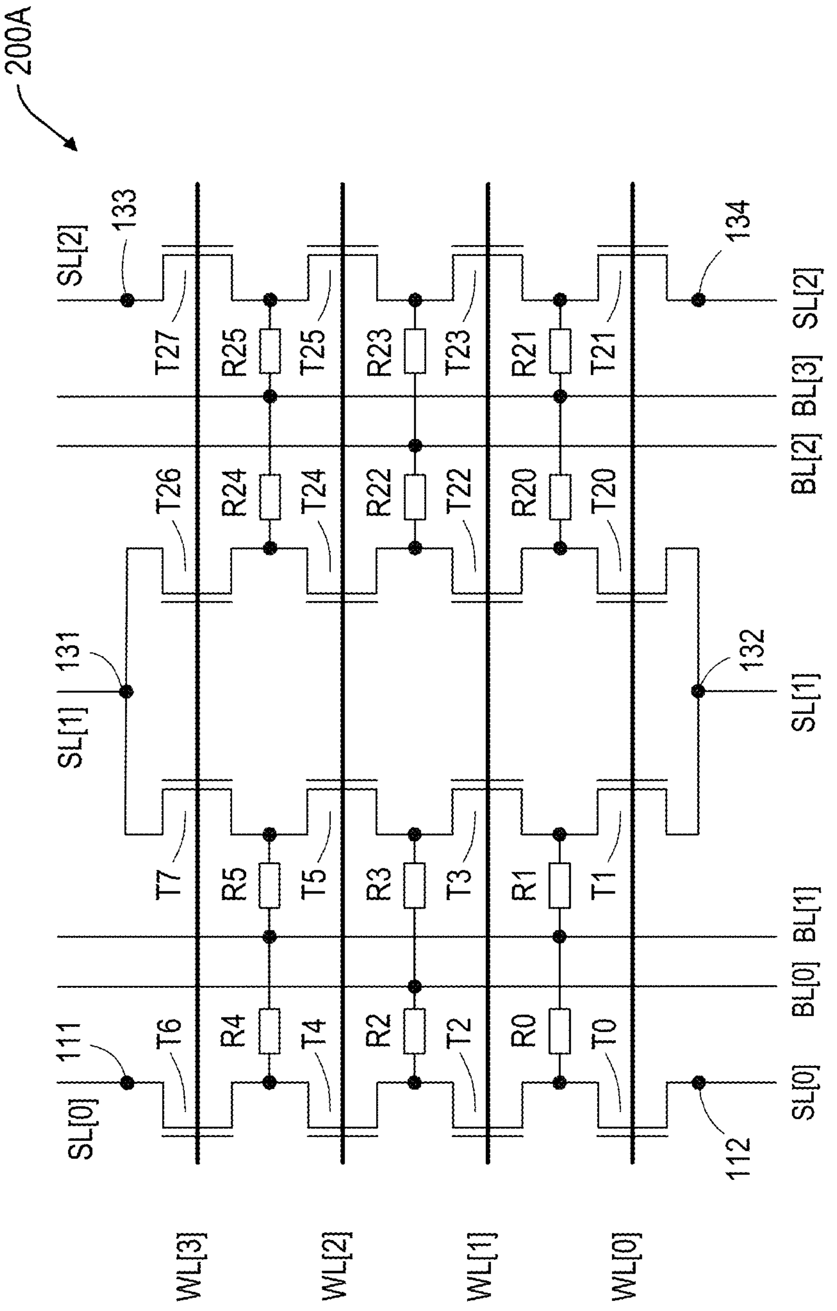
FIGS. 2A-2B are schematic circuit diagrams of various memory devices, in accordance with some embodiments.
Figure 2B:
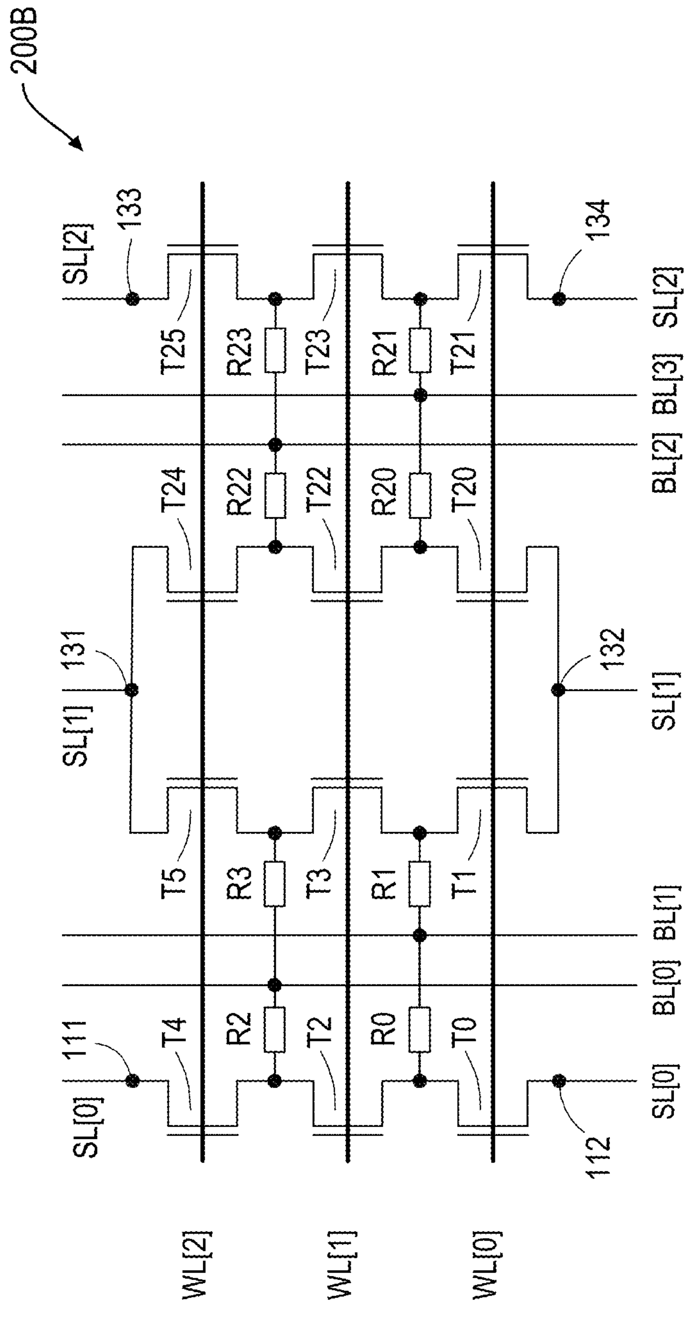

FIG. 2A is a schematic circuit diagram of a memory device 200A and FIG. 2B is a schematic circuit diagram of a memory device 200B, in accordance with some embodiments. Corresponding components in FIGS. 1, 2A, 2B are designated by the same reference numerals. The memory devices 200A, 200B further comprise controllers corresponding to the controller 102. For simplicity, the controllers of the memory devices 200A, 200B are omitted in FIGS. 2A-2B.

A difference between the memory device 200A in FIG. 2A and the memory device 100 in FIG. 1 is that, in the memory device 100, there are four data storage elements (e.g., R0, R2, R4, R6) between adjacent source line contacts (e.g., 111, 112) whereas, in the memory device 200A, there are three data storage elements (e.g., R0, R2, R4) between adjacent source line contacts (e.g., 111, 112). The word line WL[4], transistors T8, T9, T28, T29, and data storage elements R6, R7, R26, R27 of the memory device 100 are omitted in the memory device 200A. In the memory device 200A, each string or set of serially coupled transistors between adjacent source line contacts includes four transistors, and the corresponding set of data storage elements includes three data storage elements. For example, a set of serially coupled transistors between adjacent source line contacts 111, 112 includes transistors T0, T2, T4, T6, and a corresponding set of data storage elements includes data storage elements R0, R2, R4. In each set of data storage elements, two data storage elements are coupled to a bit line, and one remaining data storage element is coupled to the other bit line. For example, data storage elements R0, R4 are coupled to bit line BL[1], and data storage element R2 is coupled to bit line BL[0].

A difference between the memory device 200B in FIG. 2B and the memory device 200A in FIG. 2A is that, in the memory device 200A, there are three data storage elements (e.g., R0, R2, R4) between adjacent source line contacts (e.g., 111, 112) whereas, in the memory device 200B, there are two data storage elements (e.g., R0, R2) between adjacent source line contacts (e.g., 111, 112). The word line WL[3], transistors T6, T7, T26, T27, and data storage elements R4, R5, R24, R25 of the memory device 200A are omitted in the memory device 200B. In the memory device 200B, each string or set of serially coupled transistors between adjacent source line contacts includes three transistors, and the corresponding set of data storage elements includes two data storage elements. For example, a set of serially coupled transistors between adjacent source line contacts 111, 112 includes transistors T0, T2, T4 and a corresponding set of data storage elements includes data storage elements R0, R2. In each set of data storage elements, one data storage element is coupled to a bit line, and one remaining data storage element is coupled to the other bit line. For example, data storage elements R0 is coupled to bit line BL[1], and data storage element R2 is coupled to bit line BL[0]. In at least one embodiment, one or more advantages described herein are achievable by one or more of the memory devices 100, 200A, 200B.

FIGS. 3A-3D are schematic circuit diagrams of the memory device 100 in various operations, in accordance with some embodiments. In some embodiments, the operations of the memory device 100 are controlled by a controller, such as the controller 102. In at least one embodiment, accessing a data storage element in the memory device 100, either in a read operation or a write operation, involves turning ON a maximum of two access transistors. Hereinafter, a read operation and/or a write operation of a data storage element are commonly referred to as the data storage element being accessed.

Figure 3A:
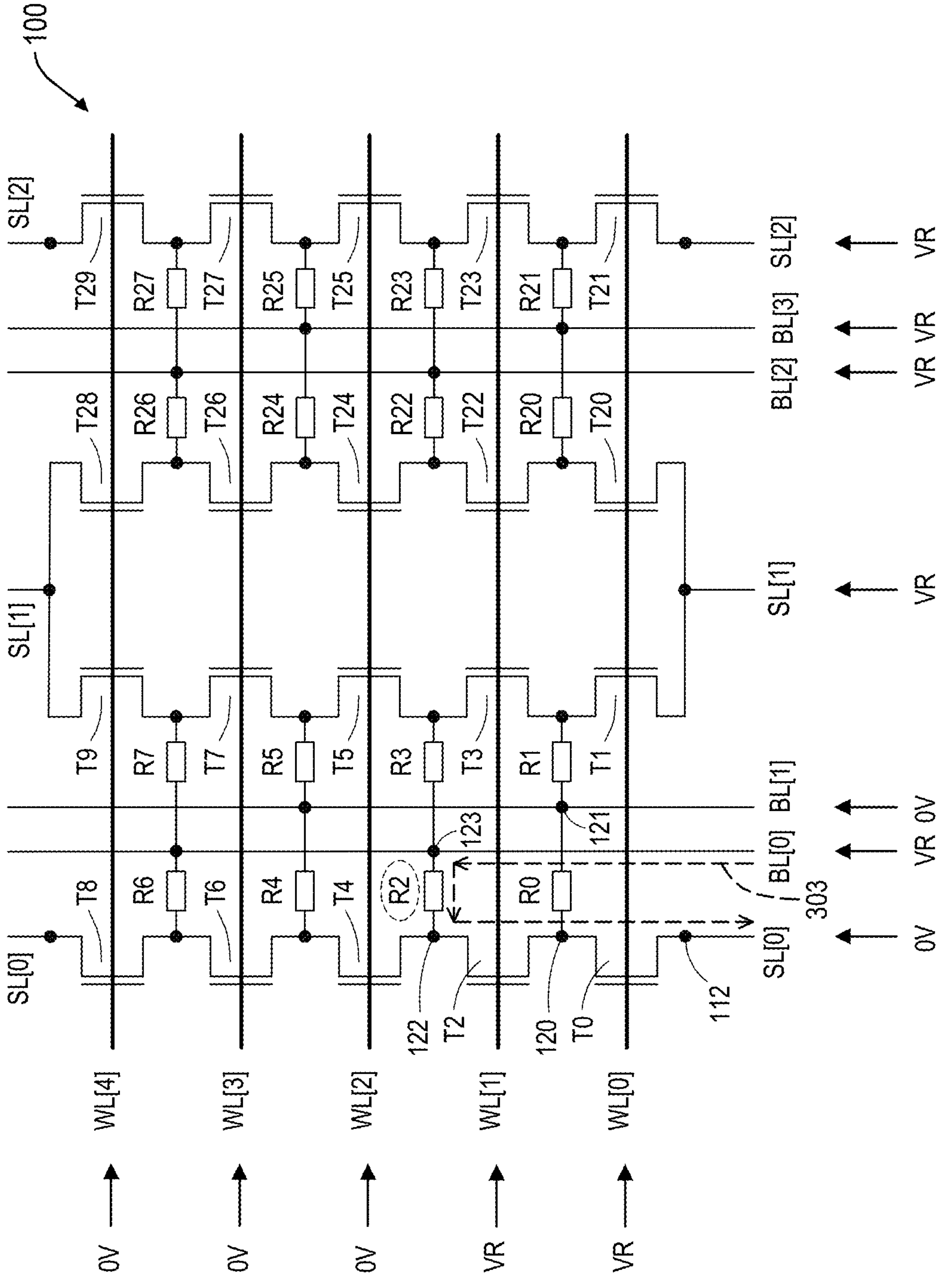
FIGS. 3A-3D are schematic circuit diagrams of a memory device in various operations, in accordance with some embodiments.

In an example operation in FIG. 3A, the data storage element R2 is selected to be access in a forward read or write operation in which a read/write current path is a forward current path from a bit line to a source line. The controller 102 is configured to apply a turn-ON voltage VR to the word lines WL[0], WL[1] to turn ON the corresponding transistors T0, T2. As a result, the end 122 of the data storage element R2 is coupled through the turned ON transistors T2, T0 to the source line contact 112 of the source line SL[0]. The other end 123 of the data storage element R2 is already coupled to the bit line BL[0]. The controller 102 is configured to apply a first voltage to the source line SL[0] and a different second voltage to the bit line BL[0], to apply an access voltage from the source line SL[0] and bit line BL[0] across the data storage element R2, to access, i.e., read from or write to the data storage element R2. In the example in FIG. 3A, the first voltage is a reference voltage such as the ground voltage (0V) and the second voltage is the voltage VR. Other voltage values are within the scopes of various embodiments. The voltage VR on the bit line BL[0] is higher than the ground voltage on the source line SL[0], and causes a read current or write current to flow, as indicated by a current path 303, from the bit line BL[0], through the data storage element R2, through the turned ON transistors T2, T0, to the source line SL[0]. As a result, the data storage element R2 is read from or written to.

Because the transistor T0 is turned ON while the data storage element R2 is being accessed, the data storage element R0 is coupled between bit line BL[1] and source line SL[0]. To prevent current leakage from the bit line BL[1] to the source line SL[0] through the data storage element R0, the controller 102 is configured to apply the same voltage, i.e., the ground voltage, as that applied to the source line SL[0] to the bit line BL[1]. For similar reasons to prevent current leakage and/or read/write disturbs, the controller 102 is configured to apply the ground voltage to the other word lines WL[2]-WL[4] for turning OFF the transistors on the other word lines WL[2]-WL[4], and to apply the voltage VR to the other source lines SL[1]-SL[2] and bit lines BL[2]-BL[3]. In some embodiments, to prevent current leakage and/or read/write disturbs, the controller 102 is configured to place one or more of the word lines, source lines, bit lines in a floating state.

When the data storage element R0 is selected to be accessed in a forward read or write operation, it is sufficient to turn ON the transistor T0. The controller 102 is configured to apply the voltage VR to the word line WL[0] to turn on the transistor T0, apply the ground voltage to the source line SL[0], and apply the voltage VR to the bit line BL[1] for applying the access voltage across the data storage element R0, to access, i.e., read from or write to the data storage element R0. The read/write current path is from the bit line BL[1], through the data storage element R0, to the source line SL[0]. To prevent current leakage and/or read/write disturbs, the controller 102 is configured to apply the ground voltage to the other word lines WL[1]-WL[4] for turning OFF the transistors on the other word lines WL[1]-WL[4], and to apply the voltage VR to the other source lines SL[1]-SL[2] and bit line BL[3].

Figure 3B:
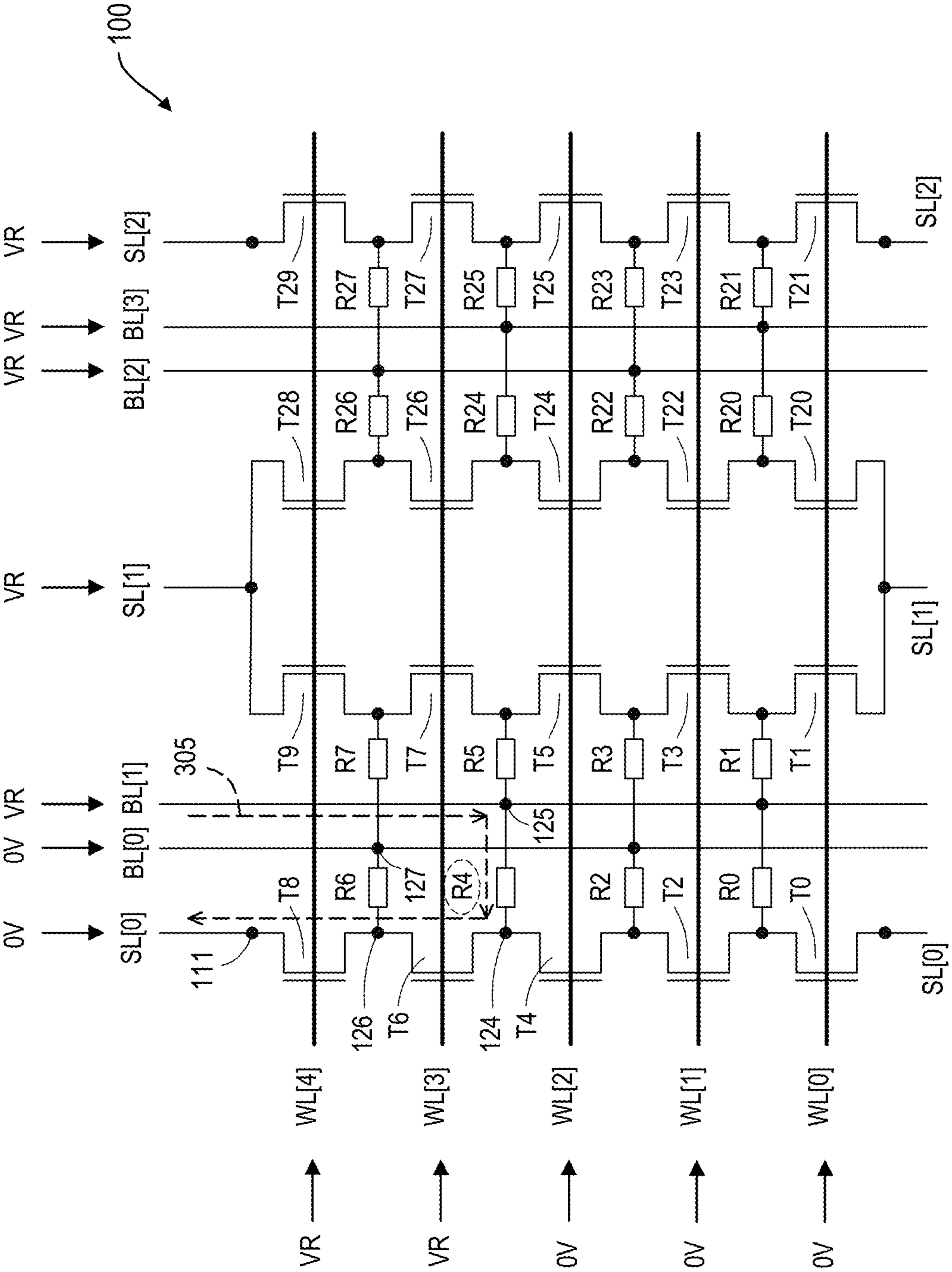

In an example operation in FIG. 3B, the data storage element R4 is selected to be access in a forward read or write operation. The controller 102 is configured to apply a turn-ON voltage VR to the word lines WL[4], WL[3] to turn ON the corresponding transistors T8, T6. As a result, the end 124 of the data storage element R4 is coupled through the turned ON transistors T6, T8 to the source line contact 111 of the source line SL[0]. The other end 125 of the data storage element R4 is already coupled to the bit line BL[1]. The controller 102 is configured to apply a first voltage, e.g., the ground voltage, to the source line SL[0] and a different second voltage, e.g., the voltage VR, to the bit line BL[1], to apply an access voltage from the source line SL[0] and bit line BL[1] across the data storage element R4, to access, i.e., read from or write to the data storage element R4. The voltage VR on the bit line BL[1] is higher than the ground voltage on the source line SL[0], and causes a read current or write current to flow, as indicated by a current path 305, from the bit line BL[1], through the data storage element R4, through the turned ON transistors T6, T8, to the source line SL[0]. As a result, the data storage element R4 is read from or written to.

To prevent current leakage from the bit line BL[0] to the source line SL[0] through the data storage element R6 when the transistor T8 is turned ON, the controller 102 is configured to apply the same voltage, i.e., the ground voltage, as that applied to the source line SL[0] to the bit line BL[0]. For similar reasons to prevent current leakage and/or read/write disturbs, the controller 102 is configured to apply the ground voltage to the other word lines WL[0]-WL[2] for turning OFF the transistors on the other word lines WL[0]-WL[2], and to apply the voltage VR to the other source lines SL[1]-SL[2] and bit lines BL[2]-BL[3]. In some embodiments, to prevent current leakage and/or read/write disturbs, the controller 102 is configured to place one or more of the word lines, source lines, bit lines in a floating state.

When the data storage element R6 is selected to be accessed in a forward read or write operation, it is sufficient to turn ON the transistor T8. The controller 102 is configured to apply the voltage VR to the word line WL[4] to turn on the transistor T8, apply the ground voltage to the source line SL[0], and apply the voltage VR to the bit line BL[0] for applying the access voltage across the data storage element R6, to access, i.e., read from or write to the data storage element R6. The read/write current path is from the bit line BL[0], through the data storage element R6, to the source line SL[0]. To prevent current leakage and/or read/write disturbs, the controller 102 is configured to apply the ground voltage to the other word lines WL[0]-WL[3] for turning OFF the transistors on the other word lines WL[0]-WL[3], and to apply the voltage VR to the other source lines SL[1]-SL[2] and bit line BL[2].

Figure 3C:
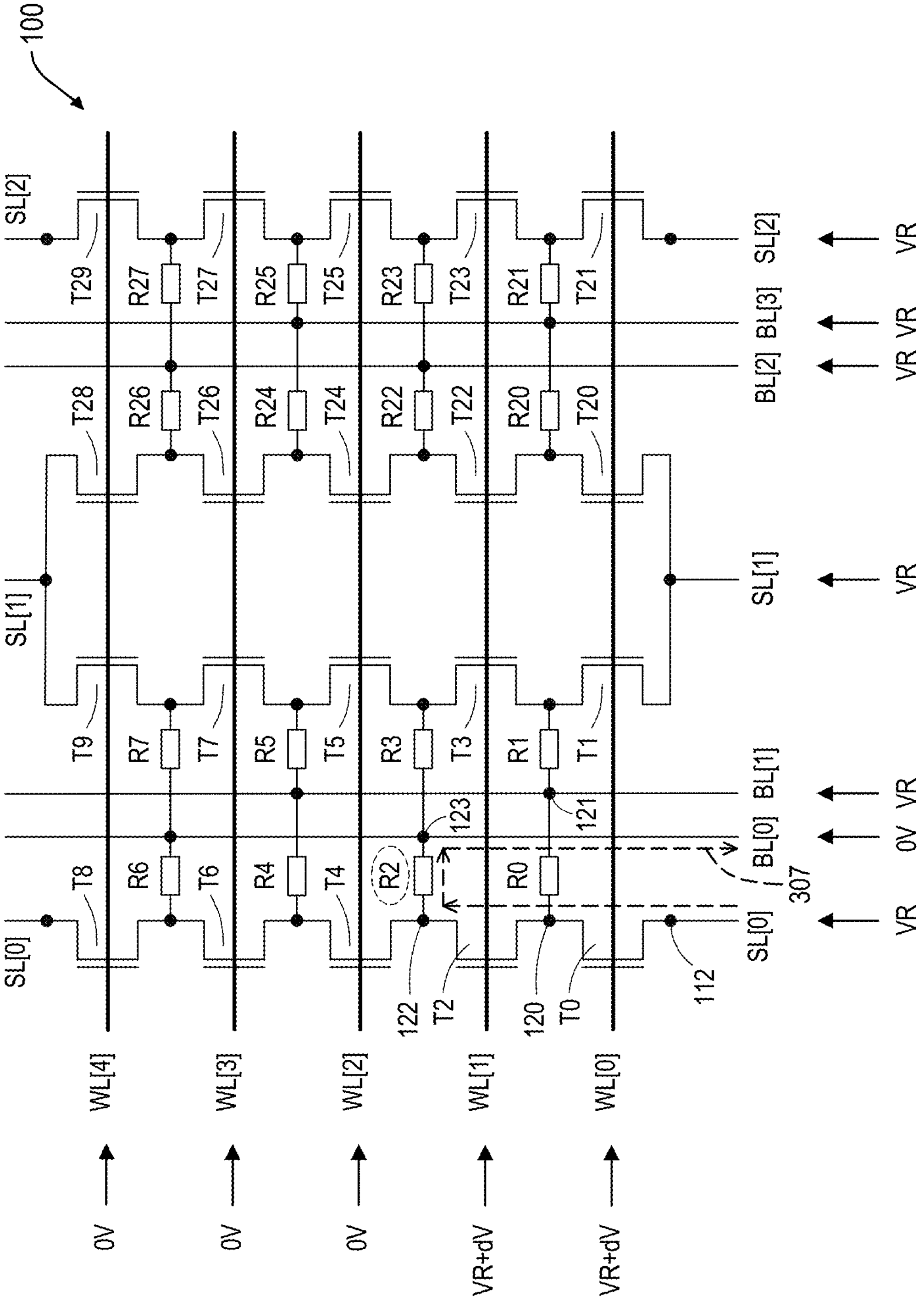

In an example operation in FIG. 3C, the data storage element R2 is selected to be access in a reverse read or write operation in which a read/write current path is a reverse current path from a source line to a bit line. The controller 102 is configured to apply a turn-ON voltage VR+dV to the word lines WL[0], WL[1] to turn ON the corresponding transistors T0, T2, and apply the second voltage, e.g., the voltage VR, to the source line SL[0], and the first voltage, e.g., the ground voltage to the bit line BL[0]. As a result, an access voltage having a sign opposite to that described with respect to FIG. 3A is applied across the data storage element R2, to access, i.e., read from or write to the data storage element R2. The voltage VR on the source line SL[0] is higher than the ground voltage on the bit line BL[0], and causes a read current or write current to flow, as indicated by a current path 307 which is in a reversed direction to the current path 303, from the source line SL[0], through the turned ON transistors T0, T2, through the data storage element R2, to the bit line BL[0]. As a result, the data storage element R2 is read from or written to. In at least one embodiment, the turn-ON voltage (VR+dV) for a reverse read or write operation is higher than the turn-ON voltage (VR) for a forward read or write operation, because transistors T2, T0 are NMOS transistors which require a higher gate voltage for transferring the voltage VR as compared to transferring the ground voltage. In at least one embodiment, dV is approximate to a threshold voltage Vth of the NMOS.

To prevent current leakage from the source line SL[0] (which is at the voltage VR) to the bit line BL[1] through the data storage element R0, the controller 102 is configured to apply the same voltage, i.e., the voltage VR, as that applied to the source line SL[0] to the bit line BL[1]. For similar reasons to prevent current leakage and/or read/write disturbs, the controller 102 is configured to apply the ground voltage to the other word lines WL[2]-WL[4] for turning OFF the transistors on the other word lines WL[2]-WL[4], and to apply the voltage VR to the other source lines SL[1]-SL[2] and bit lines BL[2]-BL[3]. In some embodiments, to prevent current leakage and/or read/write disturbs, the controller 102 is configured to place one or more of the word lines, source lines, bit lines in a floating state.

When the data storage element R0 is selected to be accessed in a reverse read or write operation, it is sufficient to turn ON the transistor T0. The controller 102 is configured to apply the voltage VR+dV to the word line WL[0] to turn on the transistor T0, apply the voltage VR to the source line SL[0], and apply the ground voltage to the bit line BL[1]. To prevent current leakage and/or read/write disturbs, the controller 102 is configured to apply the ground voltage to the other word lines WL[1]-WL[4] for turning OFF the transistors on the other word lines WL[1]-WL[4], and to apply the ground voltage to the other source lines SL[1]-SL[2] and bit line BL[3].

Figure 3D:
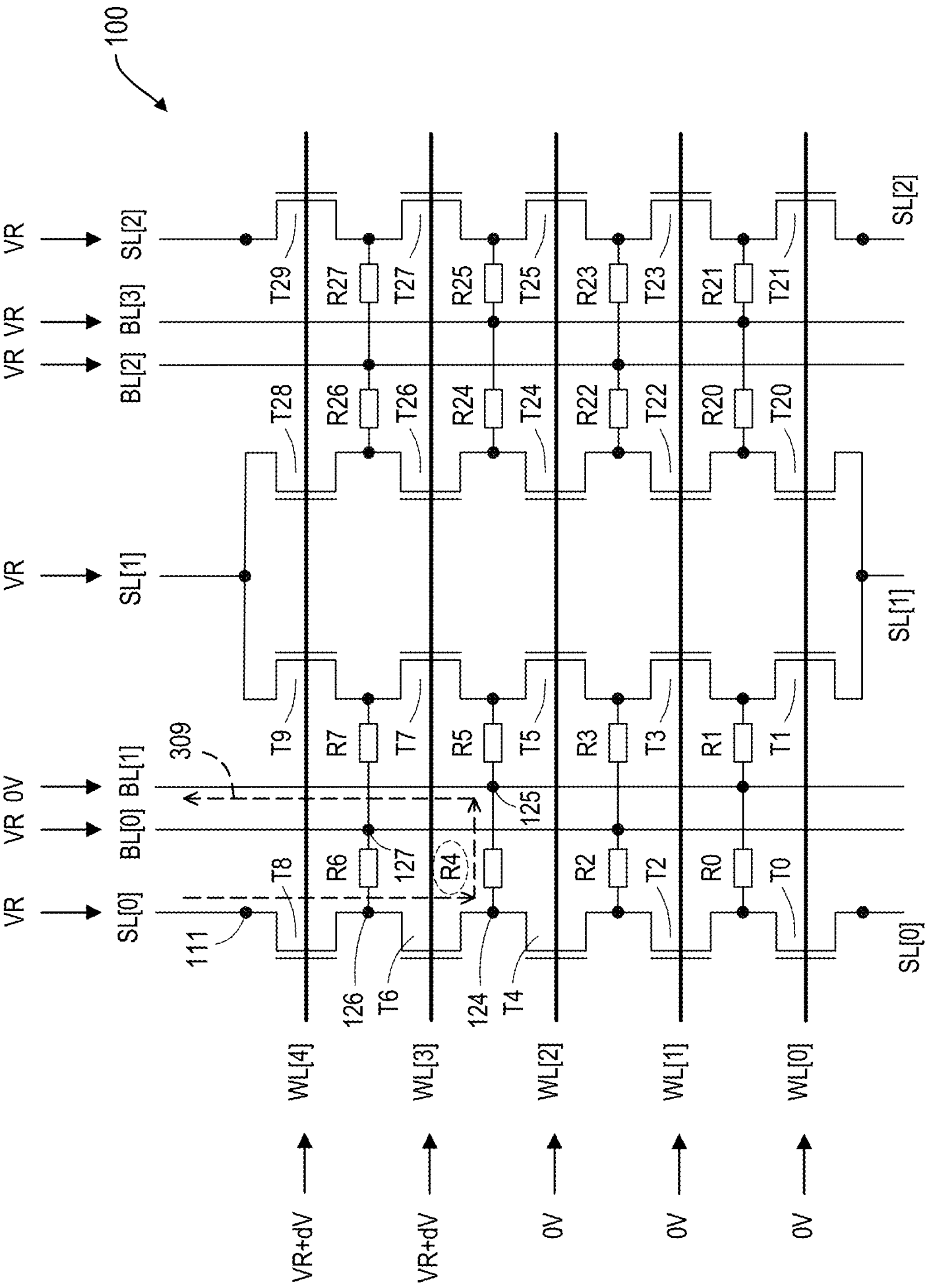

In an example operation in FIG. 3D, the data storage element R4 is selected to be access in a reverse read or write operation. The controller 102 is configured to apply a turn-ON voltage VR+dV to the word lines WL[4], WL[3] to turn ON the corresponding transistors T8, T6, and apply the second voltage, e.g., the voltage VR, to the source line SL[0], and the first voltage, e.g., the ground voltage to the bit line BL[1]. As a result, an access voltage having a sign opposite to that described with respect to FIG. 3B is applied across the data storage element R4, to access, i.e., read from or write to the data storage element R4. The voltage VR on the source line SL[0] is higher than the ground voltage on the bit line BL[1], and causes a read current or write current to flow, as indicated by a current path 309 which is in a reversed direction to the current path 305, from the source line SL[0], through the turned ON transistors T8, T6, through the data storage element R4, to the bit line BL[1]. As a result, the data storage element R4 is read from or written to.

To prevent current leakage from the source line SL[0] (which is at the voltage VR) to the bit line BL[0] through the data storage element R6, the controller 102 is configured to apply the same voltage, i.e., the voltage VR, as that applied to the source line SL[0] to the bit line BL[0]. For similar reasons to prevent current leakage and/or read/write disturbs, the controller 102 is configured to apply the ground voltage to the other word lines WL[0]-WL[2] for turning OFF the transistors on the other word lines WL[0]-WL[2], and to apply the voltage VR to the other source lines SL[1]-SL[2] and bit lines BL[2]-BL[3]. In some embodiments, to prevent current leakage and/or read/write disturbs, the controller 102 is configured to place one or more of the word lines, source lines, bit lines in a floating state.

When the data storage element R6 is selected to be accessed in a reverse read or write operation, it is sufficient to turn ON the transistor T8. The controller 102 is configured to apply the voltage VR+dV to the word line WL[4] to turn on the transistor T8, apply the voltage VR to the source line SL[0], and apply the ground voltage to the bit line BL[0]. To prevent current leakage and/or read/write disturbs, the controller 102 is configured to apply the ground voltage to the other word lines WL[0]-WL[3] for turning OFF the transistors on the other word lines WL[0]-WL[3], and to apply the ground voltage to the other source lines SL[1]-SL[2] and bit line BL[2].

Figure 4:
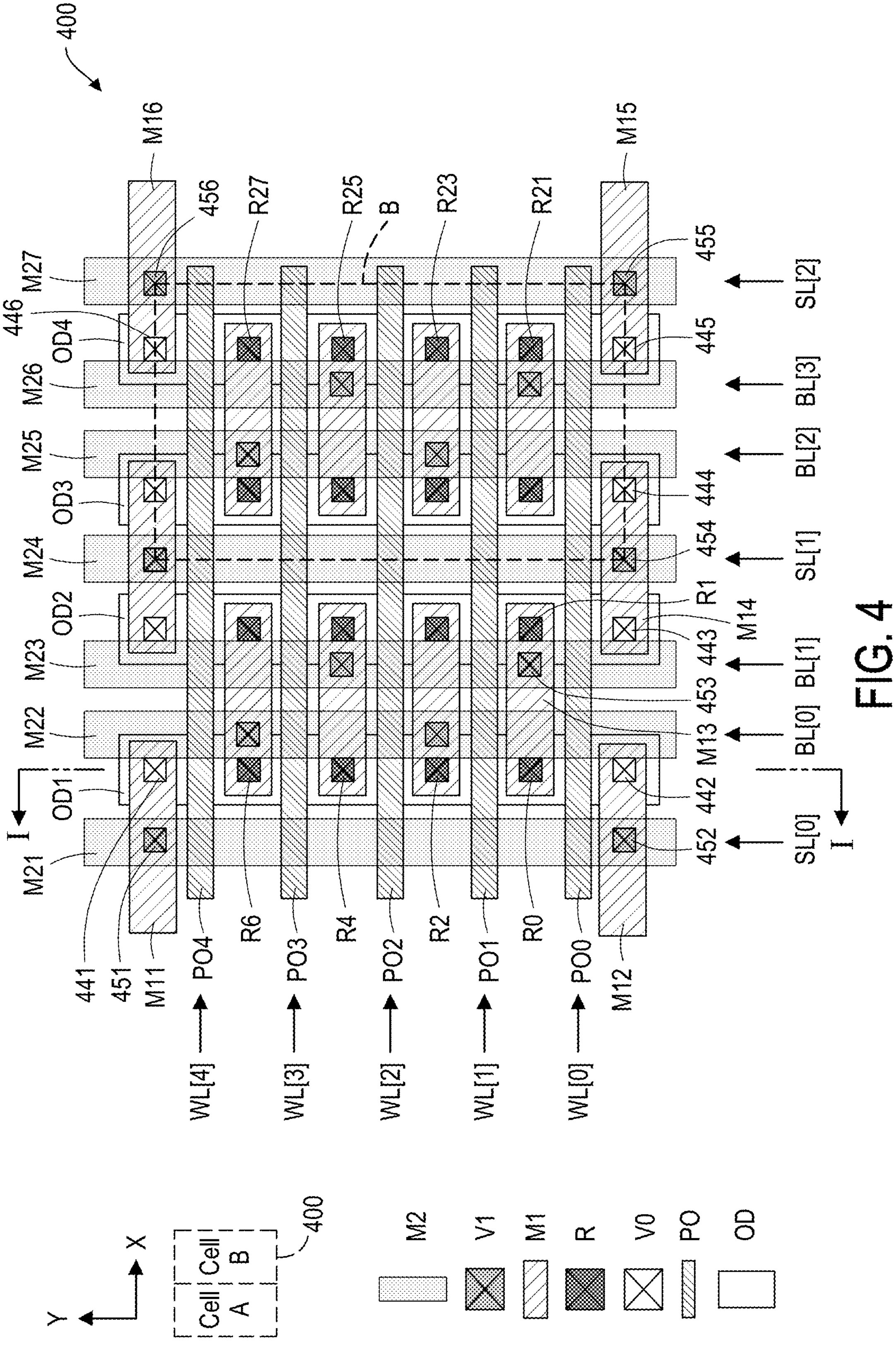
FIG. 4 is a schematic view of an IC layout diagram of a memory device, in accordance with some embodiments.

FIG. 4 is a schematic view of an IC layout diagram 400 of a memory device, in accordance with some embodiments. In at least one embodiment, the IC layout diagram 400 is stored on a non-transitory computer-readable medium. In at least one embodiment, the IC layout diagram 400 corresponds to an IC layout diagram of the memory device 100. Corresponding components in FIGS. 1 and 4 are designated herein by the same reference numerals.

The IC layout diagram 400 comprises a plurality of active regions OD1, OD2, OD3, OD4 continuously extending along a first direction, e.g., a y-axis direction, and a plurality of gate regions PO0, PO1, PO2, PO3, PO4 extending across the active regions OD1-OD4 along a second direction, e.g., an x-axis direction, transverse to the y-axis direction. In the example configuration in FIG. 4, the x-axis direction is perpendicular to the y-axis direction. Active regions are sometimes referred to as diffusion regions or oxide-definition (OD) regions, and are schematically illustrated in the drawings with the label "OD." The active regions include P-type dopants and/or N-type dopants to form one or more circuit elements or devices. Examples of circuit elements include, but are not limited to, transistors and diodes. An active region configured to form one or more PMOS devices therein is referred to as "PMOS active region," and an active region configured to form one or more NMOS devices therein is referred to as "NMOS active region." For example, the active regions OD1-OD4 are NMOS active regions configured to form NMOS access transistors, as described herein. Other transistor configurations are within the scopes of various embodiments. Each of the gate regions PO0-PO4 includes a conductive material, such as, polysilicon, and is schematically illustrated in the drawings with the label "PO." Other conductive materials for the gate regions, such as metals, are within the scope of various embodiments.

The gate regions PO0-PO4 and the active regions OD1-OD4 configure a plurality of transistors corresponding to the access transistors in the memory device 100. For simplicity, the transistors are not indicated by reference numerals in FIG. 4. For example, the gate regions PO0-PO4 correspondingly configure, together with the active region OD1, a string of serially coupled transistors T0, T2, T4, T6, T8 of the memory device 100. The gate regions PO0-PO4 correspondingly configure, together with the active region OD2, a string of serially coupled transistors T1, T3, T5, T7, T9 of the memory device 100. The gate regions PO0-PO4 correspondingly configure, together with the active region OD3, a string of serially coupled transistors T20, T22, T24, T26, T28 of the memory device 100. The gate regions PO0-PO4 correspondingly configure, together with the active region OD4, a string of serially coupled transistors T21, T23, T25, T27, T29 of the memory device 100. The active region OD1 and the corresponding transistors T0, T2, T4, T6, T8 formed thereover are described in detail herein. The other active regions OD2-OD4 and the corresponding transistors are similarly configured.

The gate regions PO0-PO4 divide the active region OD1 into a plurality of source/drain regions, each of the gate regions PO0-PO4 arranged between a corresponding pair of source/drain regions among the plurality of source/drain regions. For simplicity, the source/drain regions are not indicated by separate reference numerals in FIG. 4; instead, the source/drain regions are described with reference to other features thereover. For example, the transistor T0 configured by the gate region PO0 and the active region OD1 has a first source/drain region under a via 442, and a second source/drain region under a data storage element R0. The first source/drain region under the via 442 corresponds to the source line contact 112 in FIG. 1. The second source/drain region under the data storage element R0 corresponds to the common terminal 120 of transistors T0, T2 in FIG. 1. The plurality of source/drain regions in the active region OD1 further comprises a source/drain region under a via 441 and corresponding to the source line contact 111 in FIG. 1, and source/drain regions correspondingly under data storage elements R2, R4, R6 and corresponding to common terminals 122, 124, 126 in FIG. 1. Herein, a "source/drain region" means a source region or a drain region.

Each of the data storage elements R0, R2, R4, R6 comprises a multilayer structure as described herein, and is schematically represented in FIG. 4 with a label "R" and a via symbol. The IC layout diagram 400 comprises sixteen data storage elements corresponding to the sixteen data storage elements in the memory device 100. For simplicity, data storage elements R0, R1, R2, R4, R6, and R21, R23, R25, R27 are designated in FIG. 4, whereas the other data storage elements are not designated with corresponding reference numerals.

In some embodiments, the IC layout diagram 400 further comprises source/drain contact regions (not shown in FIG. 4) which overlap and are configured to form electrical connections to the source/drain regions in the active regions OD1-OD4. The source/drain contact regions are sometimes referred to as "MD regions." The MD regions are arranged alternatingly with the gate regions PO0-PO4 along the y-axis direction.

In some embodiments, the IC layout diagram 400 further comprises conductive vias (not shown) over and in electrical contact with the corresponding gate regions or MD regions. A via over and in electrical contact with an MD region is sometimes referred to as via-to-device, and is schematically illustrated in the drawings with the label "VD." A via over and in electrical contact with a gate region is sometimes referred to as via-to-gate (VG).

The IC layout diagram 400 further comprises a plurality of metal layers and via layers sequentially and alternatingly arranged over the VD and VG vias. The lowermost metal layer immediately over and in electrical contact with the VD and VG vias is the M0 layer, i.e., metal-zero (M0) layer, a next metal layer immediately over the M0 layer is the M1 layer, a next metal layer immediately over the M1 layer is the M2 layer, or the like. A via layer Vn is arranged between and electrically couple the Mn layer and the Mn+1 layer, where n is an integer form zero and up. For example, a via-zero (V0) layer is the lowermost via layer which is arranged between and electrically couple the M0 layer and the M1 layer. Other via layers are V1, V2, or the like. The Mn metal layer comprises various conductive patterns which are referred to as Mn conductive patterns. The Vn via layer comprises various vias which are referred to as Vn vias. In the IC layout diagram 400, M0 conductive patterns are omitted for simplicity. Example M0 conductive patterns are described with respect to FIGS. 5, 7A.

The data storage elements R0, R1, R2, R4, R6, . . . . R21, R23, R25, R27 and V0 vias are over and coupled to corresponding M0 conductive patterns. For simplicity, not all V0 vias in the IC layout diagram 400 are designated with corresponding reference numerals. Several V0 vias 441, 442, 443, 444, 445, 446 are designated and correspond to various source line contacts as described herein.

M1 conductive patterns are over and coupled to corresponding data storage elements R0, R1, R2, R4, R6, . . . . R21, R23, R25, R27 and V0 vias. For simplicity, not all M1 conductive patterns in the IC layout diagram 400 are designated with corresponding reference numerals. Several M1 conductive patterns M11, M12, M13, M14, M15, M16 are designated. The M1 conductive pattern M11 is over and coupled to the V0 via 441. The M1 conductive pattern M12 is over and coupled to the V0 via 442. The M1 conductive pattern M13 is over and couples the data storage elements R0, R1 with each other. The M1 conductive pattern M14 is over and couples the V0 vias 443, 444 with each other. The M1 conductive pattern M15 is over and coupled to the V0 via 445. The M1 conductive pattern M16 is over and coupled to the V0 via 446. The M1 conductive patterns are elongated along the x-axis direction.

V1 vias are over and coupled to corresponding M1 conductive patterns. For simplicity, not all V1 vias in the IC layout diagram 400 are designated with corresponding reference numerals. Several V1 vias 451, 452, 453, 454, 455, 456 are designated. The V1 vias 451, 452, 453, 454, 455, 456 are correspondingly over and coupled to the M1 conductive patterns M11, M12, M13, M14, M15, M16.

M2 conductive patterns M21-M27 are over and coupled to corresponding V1 vias. The M2 conductive pattern M21 is over and couples the V1 vias 451, 452 with each other, and corresponds to the source line SL[0]. The M2 conductive pattern M22 is over and couples V1 vias connected to the data storage elements R2, R6 with each other, and corresponds to the bit line BL[0]. The M2 conductive pattern M23 is over and couples V1 vias connected to the data storage elements R0, R4 with each other, and corresponds to the bit line BL[1]. The M2 conductive pattern M24 is over and couples the V1 via 454 and another V1 via with each other, and corresponds to the source line SL[1]. The M2 conductive pattern M25 is over and couples V1 vias connected to the data storage elements R23, R27 with each other, and corresponds to the bit line BL[2]. The M2 conductive pattern M26 is over and couples V1 vias connected to the data storage elements R21, R25 with each other, and corresponds to the bit line BL[3]. The M2 conductive pattern M27 is over and couples the V1 vias 455, 456 with each other, and corresponds to the source line SL[2]. The M2 conductive patterns are elongated along the y-axis direction.

The V0 via 441, M1 conductive pattern M11 and V1 via 451 correspond to the source line contact 111. The V0 via 442, M1 conductive pattern M12 and V1 via 452 correspond to the source line contact 112. The M1 conductive pattern M13 and V1 via 453 correspond to the end 121 between data storage elements R0, R1. The V0 vias 443, 444, M1 conductive pattern M14 and V1 via 454 correspond to the source line contact 132. The V0 via 445, M1 conductive pattern M15 and V1 via 455 correspond to the source line contact 134. The V0 via 446, M1 conductive pattern M16 and V1 via 456 correspond to the source line contact 133.

The gate regions PO0-PO4 correspond to word lines WL[0]-WL[4]. In some embodiments, the IC layout diagram 400 further comprises one or more VG vias, conductive patterns in one or more metal layers, and vias in one or more via layers to provide electrical connections to the gate regions PO0-PO4. The described configuration in which the bit lines and source lines are all in one metal layer, i.e., the M2 layer, is an example. In one or more embodiments, the bit lines are arranged in one metal layer, whereas the source lines are arranged in another metal layer. The described configuration in which the data storage elements are arranged between the M0 layer and the M1 layer is an example. In some embodiments, the data storage elements are arrangement between other, higher metal layers.

In some embodiments, the IC layout diagram 400 is constructed from cells stored in and loaded from a cell library. For example, the IC layout diagram 400 comprises cell A and cell B arranged in abutment with each other. A boundary of cell B is shown over the right side of IC layout diagram 400, and is defined by center lines of the M2 conductive patterns M24, M27 and center lines of the M1 conductive patterns M15, M16. A boundary of cell A is omitted for simplicity, and is defined by center lines of the M2 conductive patterns M21, M24 and the center lines of the M1 conductive patterns M15, M16. The boundaries of cell A and cell B abut each other along the center line of the M2 conductive pattern M24. In the example in FIG. 4, cell A and cell B have the same configuration. In some embodiments, cell A and cell B have symmetric configurations with respect to each other. For example, in at least one embodiment, the patterns and/or regions in various layers in cell A are symmetric across the y-axis direction to the corresponding patterns and/or regions in the corresponding layers in cell B. In at least one embodiment, one or more advantages described herein are achievable by one or more memory devices and/or IC devices corresponding to the IC layout diagram 400.

Figure 5:
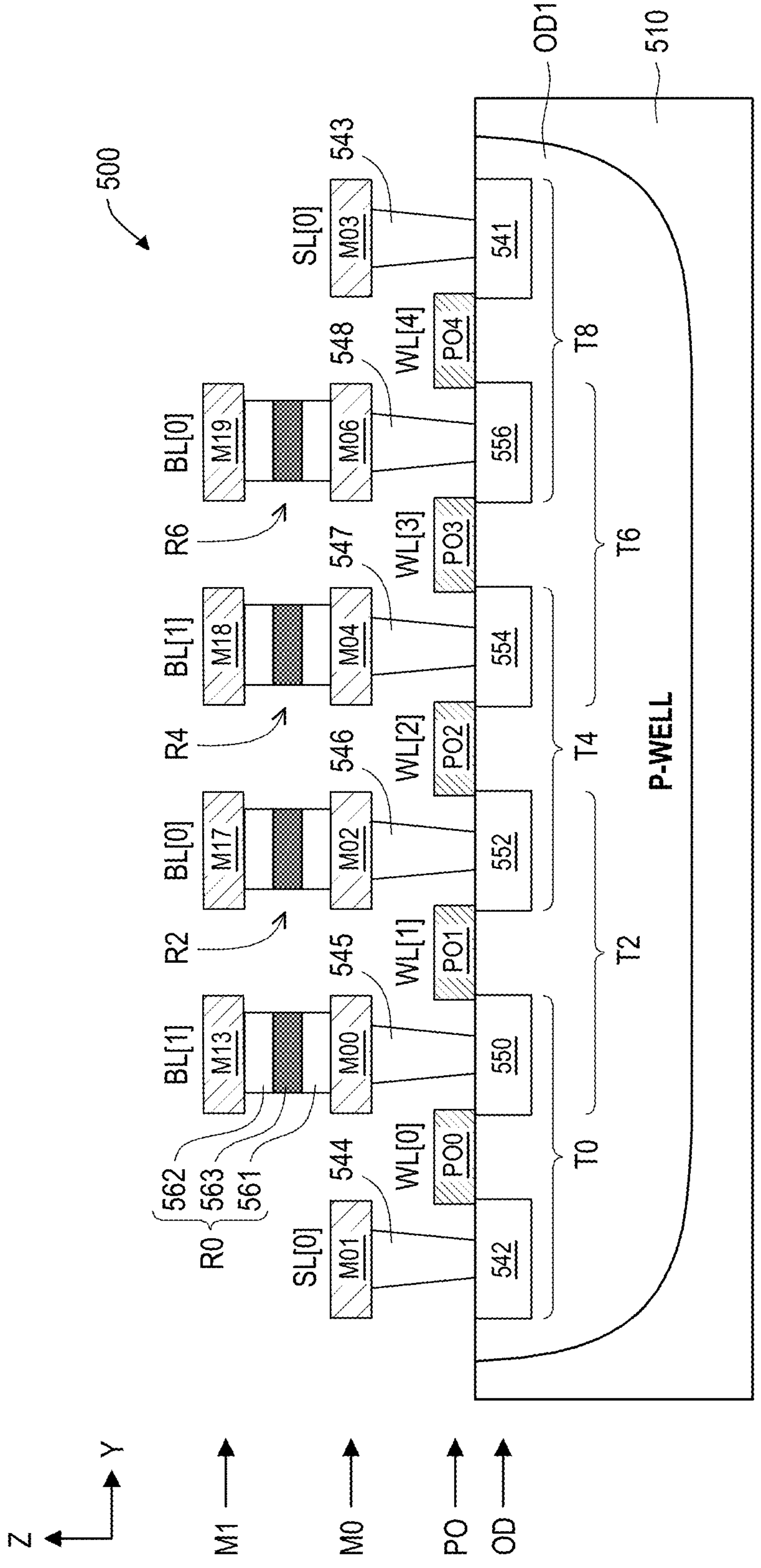
FIG. 5 is a schematic cross-sectional view of an IC device, in accordance with some embodiments.

FIG. 5 is a schematic cross-sectional view of an IC device 500, in accordance with some embodiments. In at least one embodiment, the IC device 500 corresponds to the IC layout diagram 400, and the cross-sectional view in FIG. 5 corresponds to a cross-section taken along line I-I in FIG. 4. Corresponding components in FIGS. 1, 4 and 5 are designated herein by the same reference numerals.

The IC device 500 comprises a substrate 510, and an active region OD1 over the substrate 510. The active region OD1 extends continuously along the y-axis direction. In some embodiments, the substrate 510 is a semiconductor substrate. N-type and P-type dopants are added to the substrate to correspondingly form N-wells and P-wells. In the example configuration in FIG. 5, the active region OD1 includes a P-well for forming N-type transistors. Other configurations are within the scopes of various embodiments. In some embodiments, isolation structures are formed between adjacent P-wells and N-wells. For simplicity, isolation structures are omitted from FIG. 5.

The gate regions PO0-PO4 corresponding to word lines WL[0]-WL[4] are formed over the active region OD1, and configure together with the active region OD1 a string of serially coupled transistors T0, T2, T4, T6, T8. Gate dielectric layers exist between the gate regions PO0-PO4 and the active region OD1, and are omitted in FIG. 5 for simplicity. The serially coupled transistors T0, T2, T4, T6, T8 have common source/drain regions 550, 552, 554, 556 over which data storage elements R0, R2, R4, R6 are to be formed. The transistors T0, T8 further comprise source/drain regions 542, 541 over which source line contacts are to be formed. Various contact plugs 544, 545, 546, 547, 548, 543 are correspondingly over and coupled to the source/drain regions 542, 550, 552, 554, 556, 541. In some embodiments, each of the contact plugs is formed as a source/drain contact (MD) and a corresponding VD via over the source/drain contact. Various M0 conductive patterns M01, M00, M02, M04, M06, M03 are correspondingly over and coupled to the contact plugs 544, 545, 546, 547, 548, 543. The M0 conductive patterns M01, M03 correspond to the source line contacts 112, 111 in FIG. 1, and/or the V0 vias 442, 441 in FIG. 4. The data storage elements R0, R2, R4, R6 are correspondingly formed over the M0 conductive patterns M00, M02, M04, M06. Various M1 conductive patterns M13, M17, M18, M19 are correspondingly over and coupled to the data storage elements R0, R2, R4, R6. The M1 conductive patterns M13, M18 are to be coupled to the M2 conductive pattern M23 corresponding to the bit line BL[1]. The M1 conductive patterns M17, M19 are to be coupled to the M2 conductive pattern M22 corresponding to the bit line BL[0].

Each of the data storage elements R0, R2, R4, R6 comprises a multilayer structure, as described in detail with respect to the data storage element R0. In the example configuration in FIG. 5, the data storage element R0 comprises a first or bottom electrode 561, a second or top electrode 562, and a data storage material layer 563 sandwiched between the bottom electrode 561 and top electrode 562 in a thickness direction of the substrate 510, e.g., in the z-axis direction. The bottom electrode 561 is over and coupled to the corresponding M0 conductive pattern M00, and the top electrode 562 is under and coupled to the corresponding M1 conductive pattern M13. In some embodiments, the M0 conductive pattern M00 and/or the M1 conductive pattern M13 is/are configured as an electrode of the data storage element R0, and the bottom electrode 561 and/or the top electrode 562 is/are omitted. Example materials of one or more of the bottom electrode 561 and top electrode 562 include, but are not limited to, Al, Ti, TIN, TaN, Co, Ag, Au, Cu, Ni, Cr, Hf, Ru, W, Pt, or the like. Example materials of the data storage material layer 563 include, but are not limited to, $HfO_2$, $Hf_{1-x}Zr_xO_2$, $ZrO_2$, $TiO_2$, NiO, $TaO_x$, $Cu_2O$, $Nb_2O_5$, $Al_2O_3$, or the like. In at least one embodiment, one or more advantages described herein are achievable by the IC device 500.

Figure 6A:
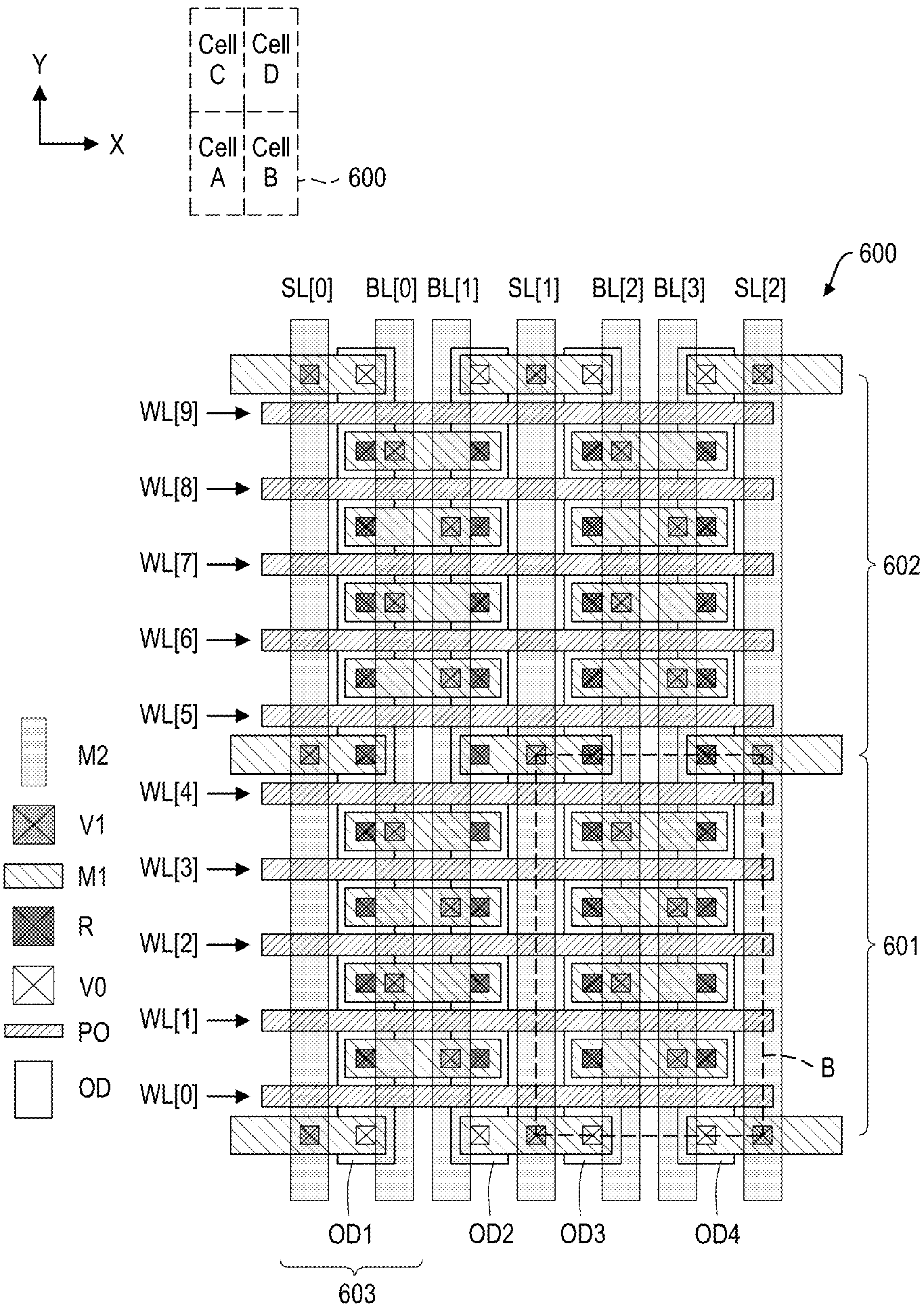
FIG. 6A is a schematic view of an IC layout diagram of a memory device, in accordance with some embodiments.

FIG. 6A is a schematic view of an IC layout diagram 600 of a memory device, in accordance with some embodiments. In at least one embodiment, the IC layout diagram 600 is stored on a non-transitory computer-readable medium. Corresponding components in FIGS. 1, 4 and 6 are designated herein by the same reference numerals.

The IC layout diagram 600 comprises a first part 601 and a second part 62. In the example configuration in FIG. 6A, the first part 601 corresponds to the IC layout diagram 400, and comprises cell A and cell B having boundaries abutting each other in the x-axis direction. The second part 602 comprises cell C and cell D having boundaries abutting each other in the x-axis direction. Cell C and cell A have the boundaries abutting each other in the y-axis direction. Cell B and cell D have the boundaries abutting each other in the y-axis direction. For simplicity, the boundary of cell B is illustrated, while the boundaries of the other cells A, C, D are omitted. The first part 601 and second part 602 of the IC layout diagram 600 share the same set of source lines SL[0]-SL[2] and the same set of bit lines BL[0]-BL[3]. However, the second part 602 of the IC layout diagram 600 comprises a further set of gate regions corresponding to a further set of word lines WL[5]-WL[9]. The gate regions corresponding to the further set of word lines WL[5]-WL[9] configure, together with the active regions OD1-OD4, access transistors which are coupled to corresponding data storage elements, the source lines SL[0]-SL[2] and the bit lines BL[0]-BL[3] in a manner similar to that described with respect to FIGS. 1, 4.

In the example in FIG. 6A, cells A-D have the same configuration. In some embodiments, two or more of cells A-D have symmetric configurations with respect to each other. For example, in at least one embodiment, the patterns and/or regions in various layers in cell A are symmetric across the x-axis direction to the corresponding patterns and/or regions in the corresponding layers in cell C. In other words, cell C is obtainable by flipping cell A across the x-axis direction. Similarly, in one or more embodiments, cell D is obtainable by flipping cell B across the x-axis direction.

In some embodiments, the IC layout diagram 600 is generated by loading one or more of cells A-D from a cell library, and placing the loaded cells in abutment along the x-axis direction and/or the y-axis direction. In some embodiments, the IC layout diagram 600 is generated as part of an automated placement and routing (APR) method. In some embodiments, one or more operations of the APR method are performed by an APR system, e.g., a system included in an EDA system described with respect to FIG. 10. In some embodiments, one or more operations of the APR method are executed by a processor, such as a processor of an EDA system described with respect to FIG. 10.

Figure 6B:
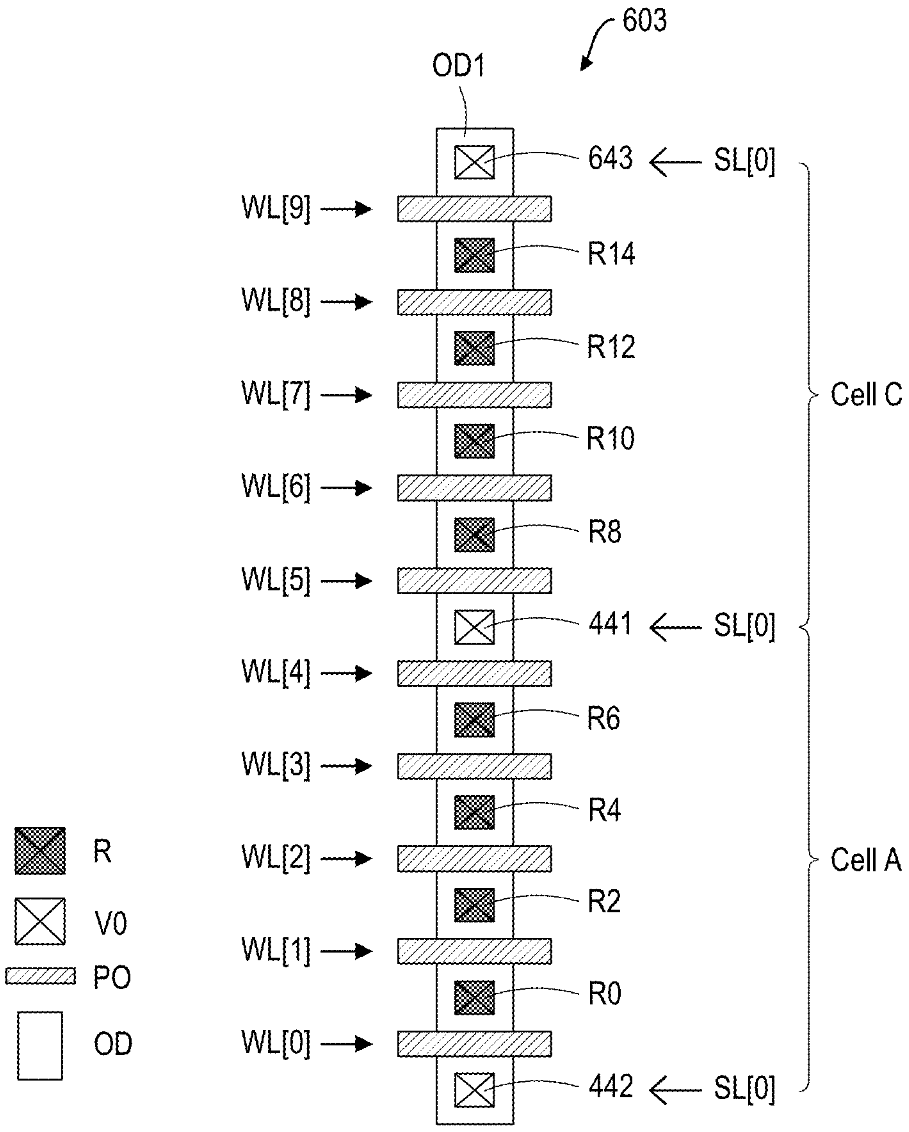
FIG. 6B is a schematic view of a portion of the IC layout diagram in FIG. 6A, in accordance with some embodiments.

FIG. 6B is a schematic view of a portion 603 corresponding to the active region OD1 in the IC layout diagram 600 in FIG. 6A, in accordance with some embodiments.

As shown in FIG. 6B, the active region OD1 extends continuously along the y-axis direction from cell A to cell C. The active region OD1 comprises source/drain regions corresponding to vias 441, 442, 643 which define source line contacts of the source line SL[0]. The via 441 and the underlying source/drain region are on the boundary between cell A and cell C. Between the source/drain regions corresponding to vias 441, 442 in cell A, the active region OD1 further comprises common source/drain regions of corresponding serially coupled transistors and underlying corresponding data storage elements R0, R2, R4, R6. Between the source/drain regions corresponding to vias 441, 643 in cell C, the active region OD1 further comprises common source/drain regions of corresponding serially coupled transistors and underlying corresponding data storage elements R8, R10, R12, R14. There is no spacing or wasted area in the active region OD1 between cell A and cell C. This is different from other approaches in which a diffusion region of a pair of 1T1R memory cells is required to be spaced from a diffusion region of an adjacent pair of 1T1R memory cells. The spacings between adjacent pairs of 1T1R memory cells in the other approaches constitute wasted chip areas. Such spacings and wasted chip areas are advantageously avoidable in one or more embodiments. In at least one embodiment, an arrangement of eight bits (eight data storage elements) as described with respect to FIG. 6B saves about 6% of chip area compared to an arrangement of eight bits in the other approaches.

Further, because an active region extends continuously from one cell to another cell in accordance with some embodiments, it is possible to effectively prevent, or at least reduce, patterning problems (e.g., the optical proximity effect (OPE)) caused by the formation of separate or spaced patterns in the other approaches. As a result, the layout in accordance with some embodiments is more uniform than in the other approaches, which makes it possible in one or more embodiments to eliminate, or at least reduce, process variations.

FIGS. 7A-7E are schematic cross-sectional views of an IC device 700 at various stages of a manufacturing process, in accordance with some embodiments. In some embodiments, the IC device 700 corresponds to one or more of the memory device 100, IC layout diagram 400, IC device 500 described herein. Components in FIGS. 7A-7E having corresponding components in FIGS. 1, 4, 5 are designated herein by the same reference numerals as in FIG. 5.

Figure 7A:
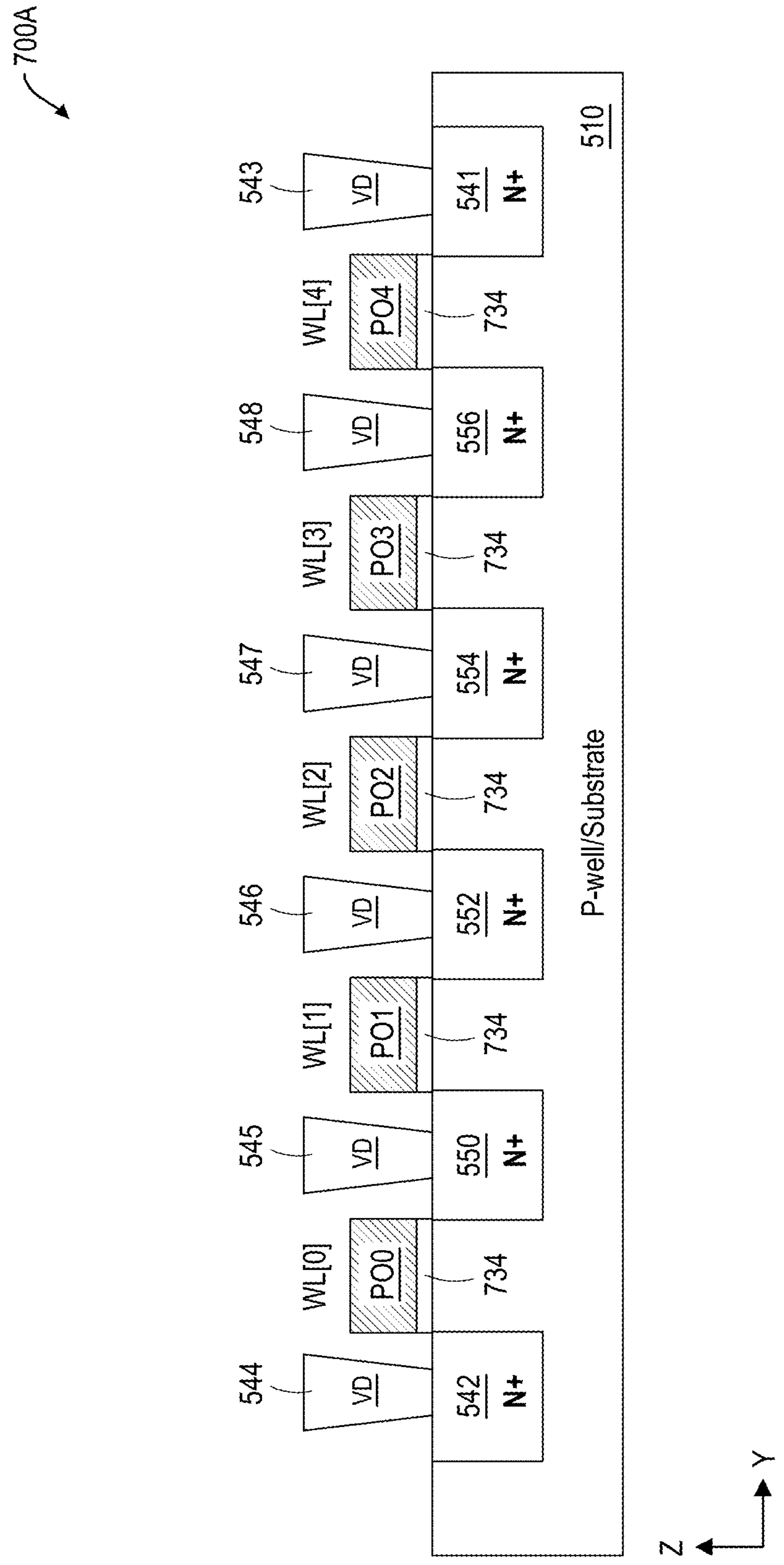
FIGS. 7A-7E are schematic cross-sectional views of an IC device at various stages of a manufacturing process, in accordance with some embodiments.

In FIG. 7A, the manufacturing process starts from a substrate 510. The substrate 510 comprises, in at least one embodiment, a silicon substrate. The substrate 510 comprises, in at least one embodiment, silicon germanium (SiGe), Gallium arsenic, or other suitable semiconductor materials. In the example configuration in FIG. 7A, the substrate 510 comprises a P-well corresponding to the P-well in FIG. 5 and also corresponding to the active region OD1. In some embodiments, multiple active regions are formed in the substrate 510. Isolation structures (not shown) are formed in the substrate 510, e.g., by etching corresponding areas of the substrate 510 and filling the etched areas with insulating material.

Various access transistors are formed over the substrate 510 in a front-end-of-line (FEOL) processing. For example, a gate dielectric is deposited over the substrate 510 having the active regions. Example materials of the gate dielectric include, but are not limited to, silicon oxide such as thermally grown silicon oxide, a high-k dielectric such as a metal oxide, or the like. Example high-k dielectrics include, but are not limited to, $HfO_2$, $Ta_2O_5$, $Al_2O_3$, $TiO_2$, TIN, $ZrO_2$, SnO, $SnO_2$, or the like. In some embodiments, the gate dielectric is deposited over the substrate 510 by atomic layer deposition (ALD) or other suitable techniques.

A gate material is deposited or formed over the gate dielectric. Example materials of the gate material include, but are not limited to, polysilicon, metal, Al, AlTi, Ti, TiN, TaN, Ta, TaC, TaSiN, W, WN, MON, and/or other suitable conductive materials. In some embodiments, the gate material is deposited by chemical vapor deposition (CVD), physical vapor deposition (PVD or sputtering), plating, atomic layer deposition (ALD), and/or other suitable processes.

The gate dielectric and gate material are patterned into a plurality of gate structures, each comprising one of gate electrode, and a underlying gate dielectric layer 734. The gate electrodes correspond to the gate regions PO0-PO4, and are designated in the drawings by the same reference numerals "PO0"-"PO4." In some embodiments, the patterning of the gate dielectric and gate material includes a photolithography operation.

The gate structures are used a mask to perform ion implantation in various regions of the active regions adjacent the gate structures, to obtain source/drain regions 542, 550, 552, 554, 556, 541 which are N+ implanted regions in the P-well to form N-type access transistors. Other types of implantation and/or well are within the scopes of various embodiments. In some embodiments, a spacer (not shown) is deposited around each gate structure. Various contact plugs 544, 545, 546, 547, 548, 543 are correspondingly formed, e.g., by deposition of a conductive material in to spaces between the spacers and/or gate structures, over the source/drain regions 542, 550, 552, 554, 556, 541. The contact plugs are labelled as "VD" in the drawings. In some embodiments, VG via structures (not shown) are formed correspondingly over the gate electrodes PO0-PO4. A resulting structure 700A is obtained, as shown in FIG. 7A.

After the FEOL processing, a back-end-of-line (BEOL) processing is performed to form an interconnect structure over the access transistors to electrically couple various elements or circuits of the IC device 700 with each other, and with external circuitry. In at least one embodiment, the interconnect structure comprises sequentially overlying metal and via layers. The overlying metal layers and via layers correspondingly comprise metal layers M0, M1, or the like, and via layers V0, V1, or the like. In at least one embodiment, the interconnect structure is manufactured sequentially layer by layer upward from the substrate 510. Various data storage elements are formed during the manufacture of the interconnect structure.

Figure 7B:
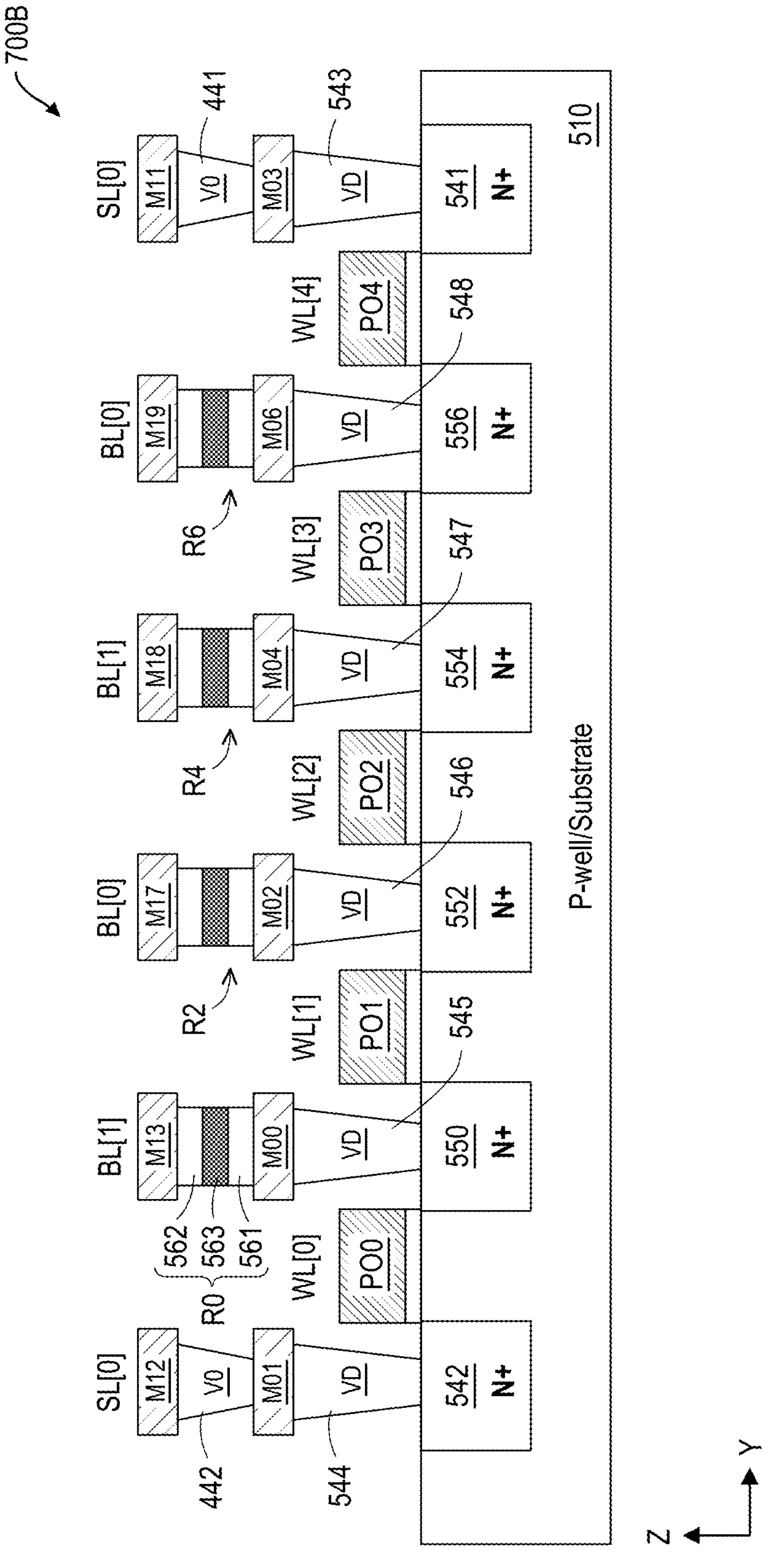

In FIG. 7B, at the beginning of the FEOL processing, a dielectric layer is deposited over the structure 700A, a M0 layer is deposited over the dielectric layer and is patterned to form M0 conductive patterns M01, M00, M02, M04, M06, M03 correspondingly over and coupled to the contact plugs 544, 545, 546, 547, 548, 543.

Various data storage elements are formed over the M0 conductive patterns M00, M02, M04, M06. Specifically, a first conductive material for forming bottom electrodes, a data storage material, and a second conductive material for forming top electrodes are sequentially deposited over a region containing the M0 conductive patterns M00, M02, M04, M06. Example conductive materials for bottom electrodes and/or top electrodes include, but are not limited to, Al, Ti, TiN, TaN, Co, Ag, Au, Cu, Ni, Cr, Hf, Ru, W, Pt, or the like. Example data storage materials include, but are not limited to, $HfO_2$, $Hf_{1-x}Zr_xO_2$, $ZrO_2$, $TiO_2$, NiO, $TaO_x$, $Cu_2O$, $Nb_2O_5$, $Al_2O_3$, or the like. Example processes for depositing the data storage material and/or the conductive materials include, but are not limited to, CVD, PVD (sputtering), ALD, and/or other suitable processes. The multilayer structure including the data storage material sandwiched between the first and second conductive materials is patterned in to individual data storage elements R0, R2, R4, R6. Each of the data storage elements R0, R2, R4, R6 comprises, as illustrated for data storage element R0, a bottom electrode 561, a top electrode 562, and a data storage material layer 563 sandwiched between the bottom electrode 561 and top electrode 562. A dielectric layer is deposited over the substrate 510 with the data storage elements thereon.

In a region over the data storage elements R0, R2, R4, R6, the dielectric layer is patterned to form recessed features corresponding to M1 conductive patterns M13, M17, M18, M19 to be formed latter. In a region over the M0 conductive patterns M01, M03 for source line contacts, the dielectric layer is patterned to form a damascene structure having via holes corresponding to conductive vias 442, 441 to be formed later, and recessed features corresponding to M1 conductive patterns M12, M11 to be formed latter. An example patterning process to form the damascene structure comprises two or more photolithographic patterning and anisotropic etching steps to first form the via holes, then form the overlying recessed features. A conductive material is deposited over the substrate 510 to fill in the damascene structure over the M0 conductive patterns M01, M03, to obtain the conductive vias 442, 441 and M1 conductive patterns M12, M11. The deposited conductive material also fills in the recessed features over the data storage elements R0, R2, R4, R6, to obtain the M1 conductive patterns M13, M17, M18, M19. A resulting structure 700B is obtained, as shown in FIG. 7B.

The described damascene process is performed one or more times to sequentially form vias and conductive patterns of higher via layers and metal layers of the interconnect structure over the M1 layer, to obtain the IC device 700. Several V1 vias and M2 conductive patterns of the IC device 700 are shown in FIGS. 7C-7E in dot-dot lines, because the V1 vias and M2 conductive patterns do not appear on the same cross-section as the other described features of the IC device 700.

Figure 7C:
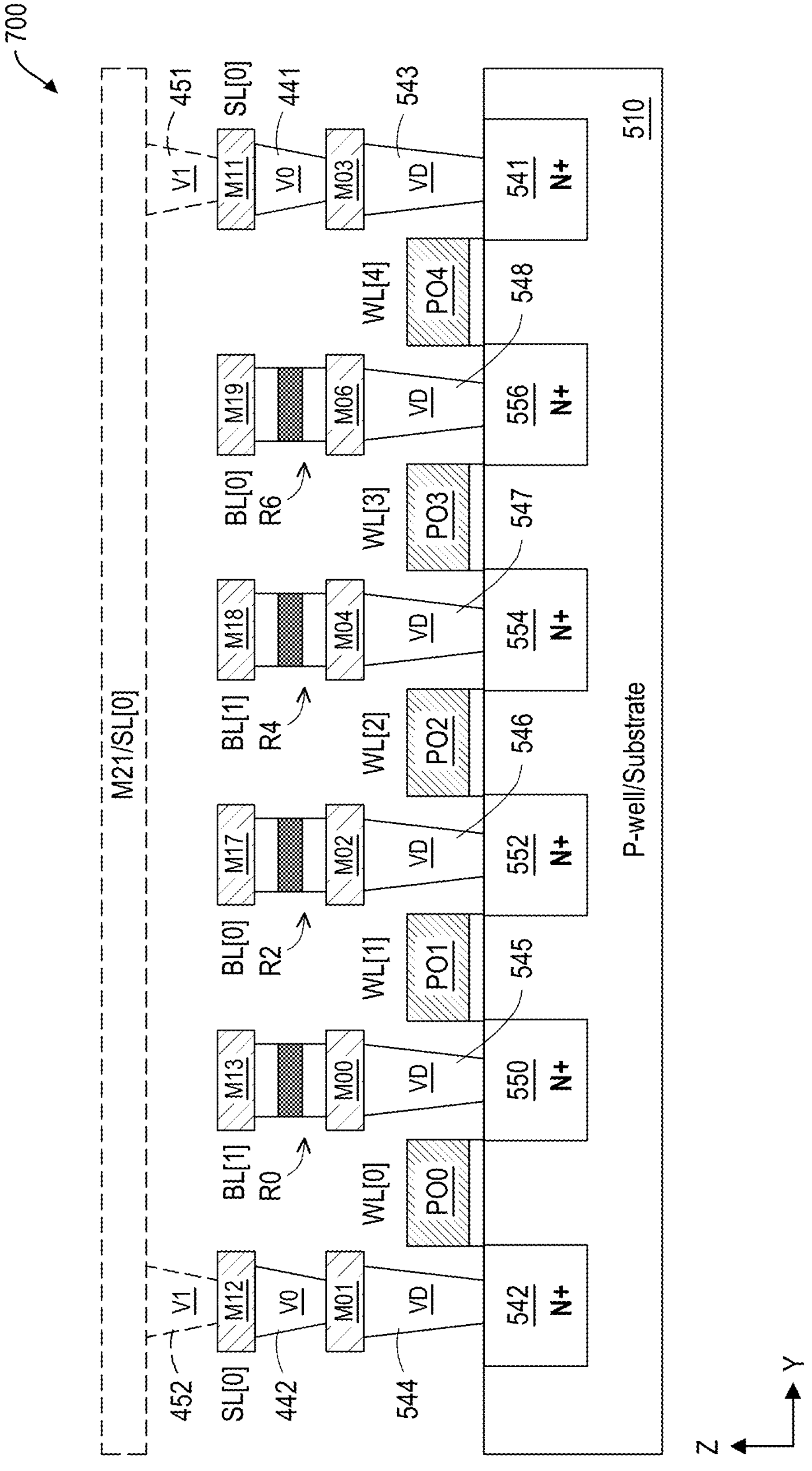

In FIG. 7C, V1 vias 452, 451 are correspondingly over the M1 conductive patterns M12, M11, and M2 conductive pattern M21 is over and couples the V1 vias 452, 451 with each other. The M2 conductive pattern M21 defines the source line SL[0].

Figure 7D:
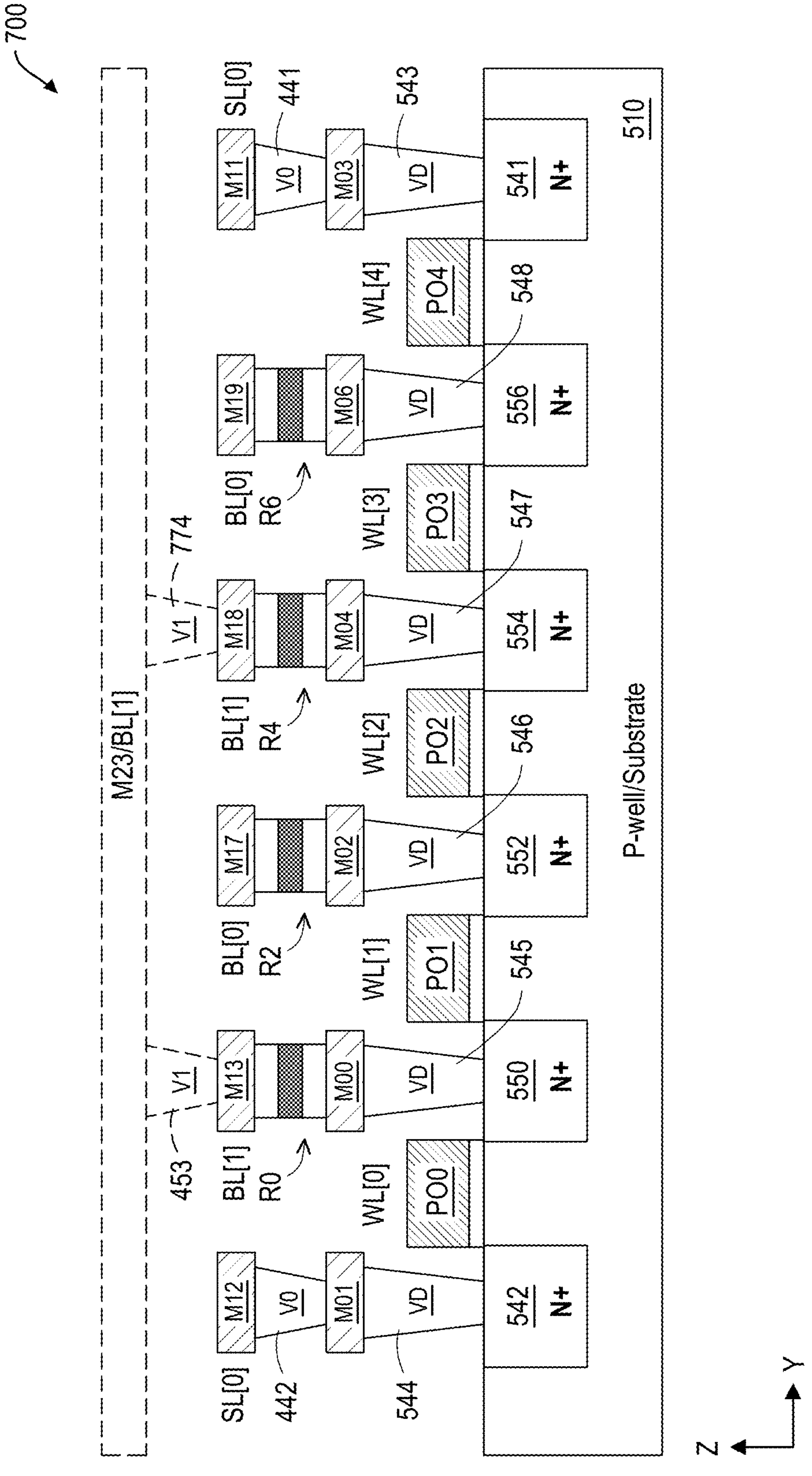

In FIG. 7D, V1 vias 453, 774 are correspondingly over the M1 conductive patterns M13, M18, and M2 conductive pattern M23 is over and couples the V1 vias 453, 774 with each other. The M2 conductive pattern M23 defines the bit line BL[1].

Figure 7E:
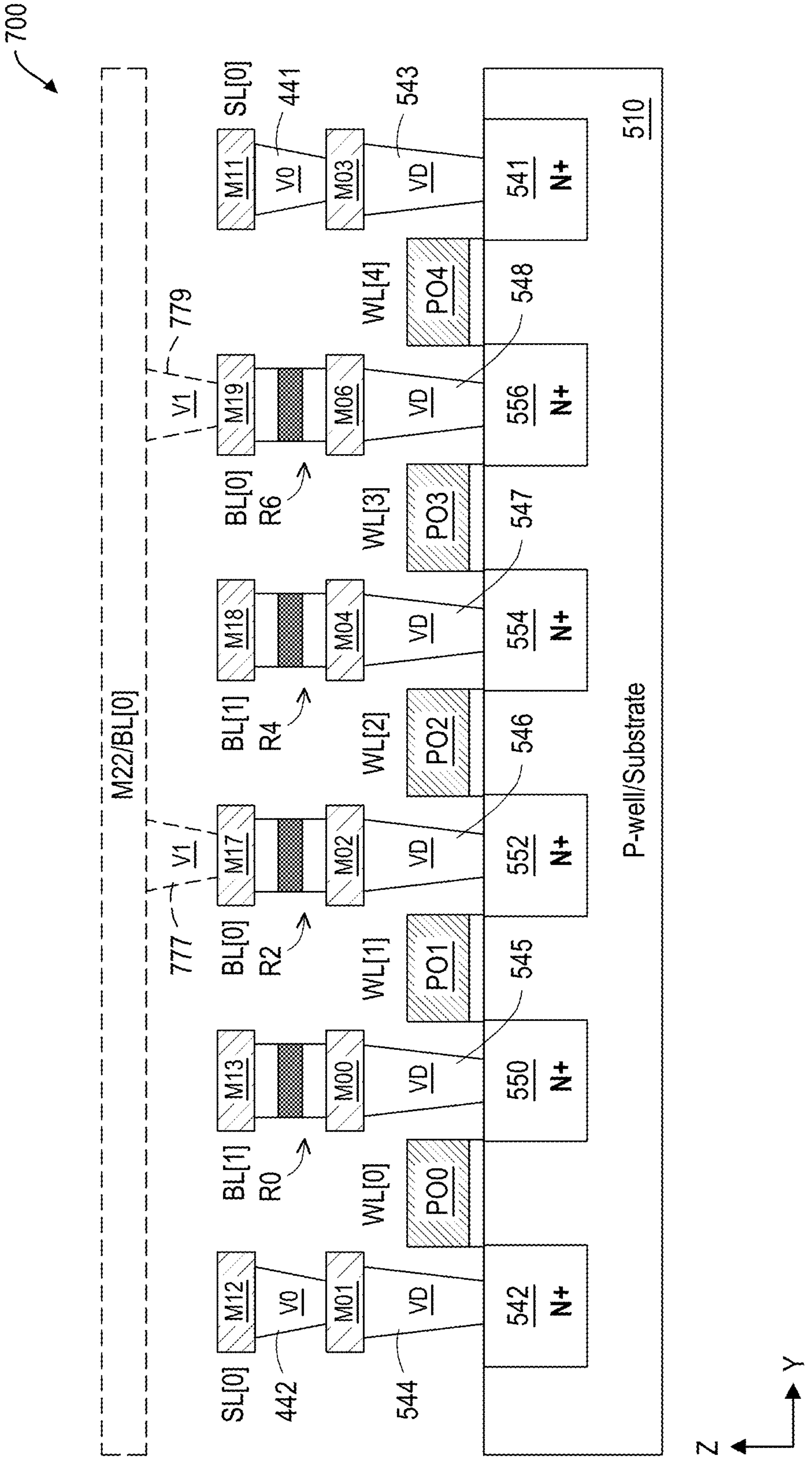

In FIG. 7E, V1 vias 777, 779 are correspondingly over the M1 conductive patterns M17, M19, and M2 conductive pattern M22 is over and couples the V1 vias 777, 779 with each other. The M2 conductive pattern M22 defines the bit line BL[0]. The V1 vias 452, 451 and M2 conductive pattern M21 in FIG. 7C, the V1 vias 453, 774 and M2 conductive pattern M23 in FIG. 7D, and the V1 vias 777, 779 and M2 conductive pattern M22 in FIG. 7E are all formed in the same damascene process. In at least one embodiment, one or more advantages described herein are achievable by the IC device 700.

Figure 8:
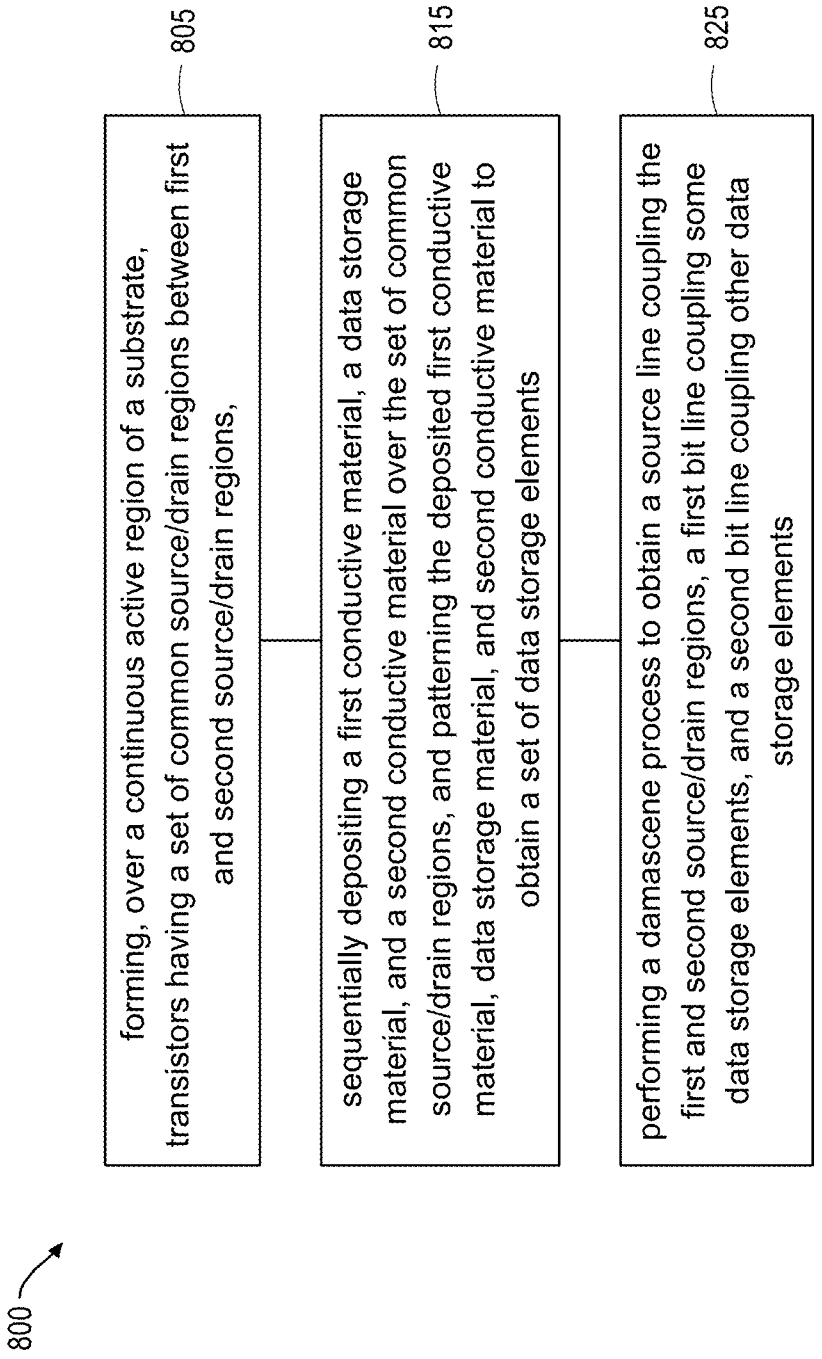
FIG. 8 is a flow chart of a manufacturing method, in accordance with some embodiments.

FIG. 8 is a flow chart of a method 800 of manufacturing an IC device, in accordance with some embodiments. In at least one embodiment, the IC device being manufactured by the method 800 corresponds to the IC device 700, or to one or more of the memory devices and/or IC devices described herein.

At operation 805, transistors are formed over a continuous active region of a substrate. The transistors have a set of common source/drain regions between first and second source/drain regions. For example, as described with respect to FIGS. 5 and 7A, transistors T0, T2, T4, T6, T8 are formed over a continuous active region OD1 of a substrate 510. The transistors have a set of common source/drain regions 550, 552, 554, 556 between first and second source/drain regions 542, 541.

At operation 815, data storage elements are formed. Specifically, a first conductive material, a data storage material, and a second conductive material are sequentially deposited over the set of common source/drain regions, and then patterned to obtain the data storage elements. For example, as described with respect to FIG. 7B, a first conductive material corresponding to bottom electrode 561, a data storage material corresponding to data storage material layer 563, and a second conductive material corresponding to top electrode 562 are sequentially deposited over the set of common source/drain regions 550, 552, 554, 556, and then patterned to obtain the set of data storage elements R0, R2, R4, R6.

At operation 825, a damascene process is performed to obtain a source line coupling the first and second source/drain regions, a first bit line coupling some data storage elements in the set of data storage elements, and a second bit line coupling other data storage elements in the set of data storage elements. For example, as described with respect to FIG. 7B, the damascene process comprises depositing a dielectric layer over the substrate, patterning the dielectric layer to obtain a damascene structure having via holes and recessed features over the via holes, and filing a conductive material into the via holes and the recessed features of the damascene structure. As a result of the damascene process, a source line source line SL[0], a bit line BL[1] and a bit line BL[0] are obtained. The source line SL[0], i.e., M2 conductive pattern M21, couples the first and second source/drain regions 542, 541, as illustrated in FIG. 7C. The bit line BL[1], i.e., M2 conductive pattern M23, couples some data storage elements R0, R4, as illustrated in FIG. 7D. The bit line BL[0], i.e., M2 conductive pattern M22, couples other data storage elements R2, R6, as illustrated in FIG. 7E. In at least one embodiment, one or more advantages described herein are achievable by one or more memory devices and/or IC devices manufactured in accordance with the method 800.

Figure 9:
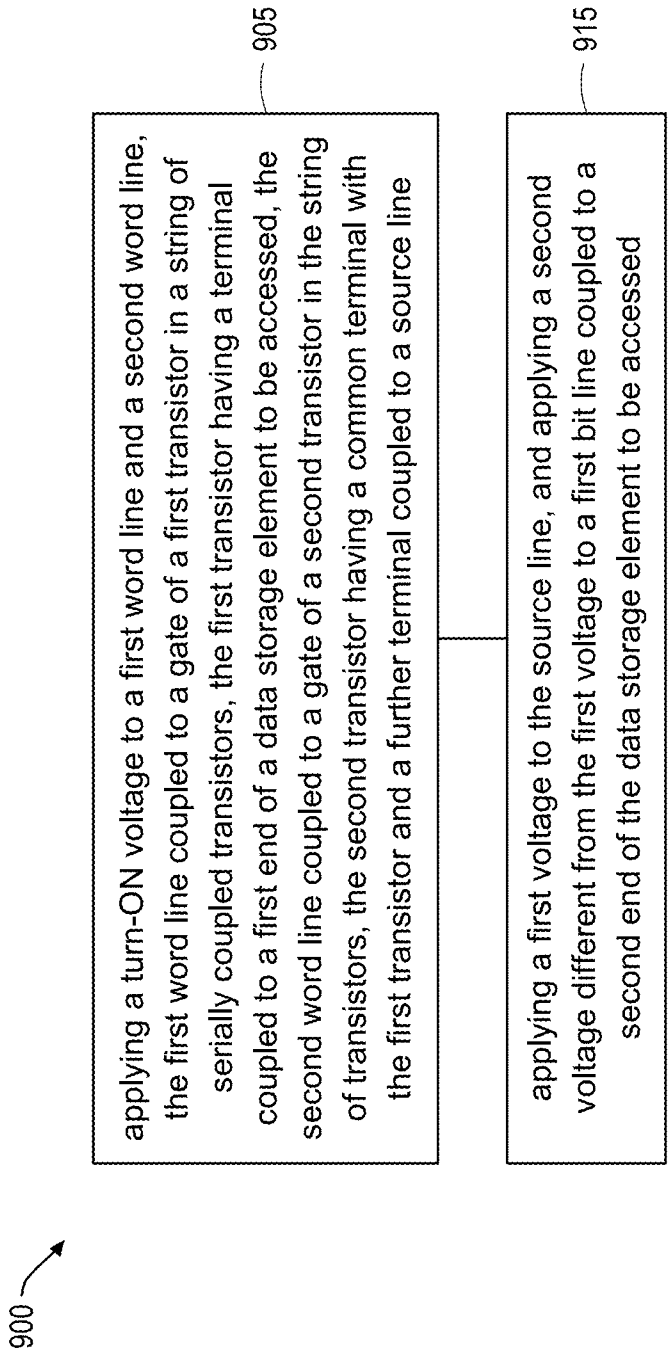
FIG. 9 is a flow chart of an operating method, in accordance with some embodiments.

FIG. 9 is a flow chart of a method 900 of operating a memory device, in accordance with some embodiments. In at least one embodiment, the memory device being operated by the method 900 corresponds to the memory device 100, or to one or more of the memory devices and/or IC devices described herein. In some embodiments, the method 900 is performed by a controller, such as the controller 102 described with respect to FIG. 1.

At operation 905, a turn-ON voltage is applied to a first word line and a second word line. The first word line is coupled to a gate of a first transistor in a string of serially coupled transistors, the first transistor having a terminal coupled to a first end of a data storage element to be accessed. The second word line is coupled to a gate of a second transistor in the string of transistors, the second transistor having a common terminal with the first transistor and a further terminal coupled to a source line. For example, as described with respect to FIG. 3A, a turn-ON voltage VR is applied to a first word line WL[1] and a second word line WL[0]. The first word line WL[1] is coupled to a gate of a first transistor T2 in a string of serially coupled transistors T0, T2, T4, T6. The first transistor T2 has a terminal 122 coupled to a first end of a data storage element R2 to be accessed. The second word line WL[0] is coupled to a gate of a second transistor T0 in the string of transistors. The second transistor T0 has a common terminal 120 with the first transistor T2, and a further terminal coupled at a source line contact 112 to a source line SL[0]. As a result of the a turn-ON voltage VR, the transistors T2, T0 are turned ON to couple the first end 122 of the data storage element R2 to the source line SL[0].

At operation 915, a first voltage is applied to the source line, and a second voltage different from the first voltage is applied to a first bit line coupled to a second end of the data storage element to be accessed. For example, as described with respect to FIG. 3A, a first voltage, i.e., 0V, is applied to the source line SL[0], and a different, second voltage VR is applied to a bit line BL[0]. The bit line BL[0] is coupled to a second end 123 of the data storage element R2 to be accessed. As a result, an access voltage corresponding to a voltage difference between the first and second voltages is applied across the data storage element R2 to read from or write to the data storage element R2. In another example, as described with respect to FIG. 3C, the first voltage applied to the source line SL[0] is VR+dV whereas the second voltage applied to the bit line BL[0] is 0V.

In some embodiments, one or more memory cells, memory devices, IC devices, and methods described are applicable to various types of transistor or device technologies including, but not limited to, planar transistor technology, FINFET technology, nanosheet FET technology, nanowire FET technology, or the like. One or more memory cells, memory devices, IC devices, and methods in accordance with some embodiments are also compatible with various technology nodes.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 10:
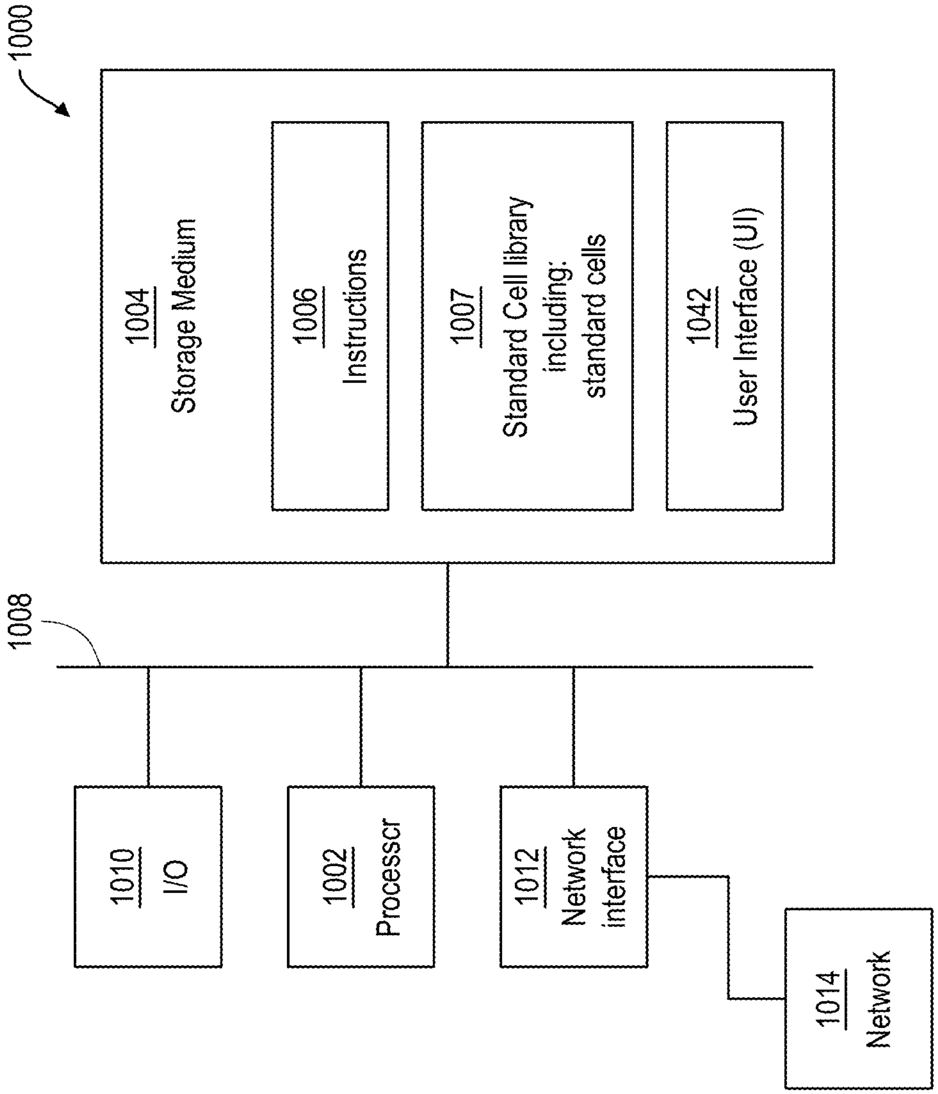
FIG. 10 is a block diagram of an EDA system, in accordance with some embodiments.

FIG. 10 is a block diagram of an electronic design automation (EDA) system 1000 in accordance with some embodiments.

In some embodiments, EDA system 1000 includes an APR system. Methods described herein of designing layout diagrams represent wire routing arrangements, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores library 1007 of standard cells including such standard cells as disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
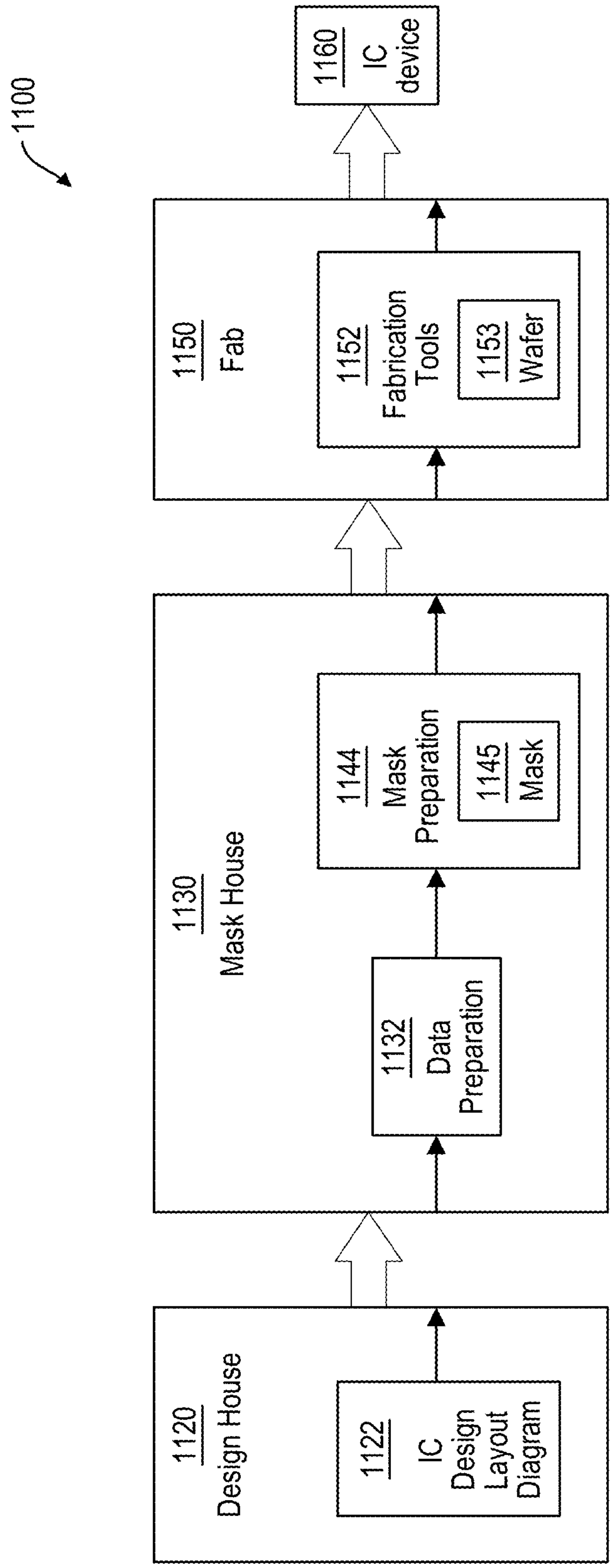
FIG. 11 is a block diagram of an IC manufacturing system and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place-and-route operation. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S.

Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a memory device comprises a set of word lines, first and second sets of bit lines, a first source line having first and second source line contacts, first and second strings of transistors electrically coupled in parallel between the first and second source line contacts of the source line, and first and second sets of data storage elements. Each word line in the set of word lines is electrically coupled to gates of a transistor in the first string and a corresponding transistor in the second string. The first set of data storage elements is electrically coupled between the first string of transistors and the first set of bit lines. The second set of data storage elements is electrically coupled between the second string of transistors and the second set of bit lines.

In some embodiments, an integrated circuit (IC) device comprises a substrate, an active region continuously extending along a first direction over the substrate, a plurality of gate regions extending across the active region along a second direction transverse to the first direction, and a set of data storage elements. The plurality of gate regions divides the active region into a plurality of source/drain regions. Each gate region among the plurality of gate regions is arranged between a corresponding pair of source/drain regions among the plurality of source/drain regions. The plurality of source/drain regions comprises first and second source/drain regions, and a set of source/drain regions between the first and second source/drain regions. The IC device further comprises, in a first metal layer over the plurality of gate regions, a plurality of conductive patterns comprising first and second conductive patterns correspondingly over and electrically coupled to the first and second source/drain regions, and a set of conductive patterns between the first and second conductive patterns and correspondingly over and electrically coupled to the set of source/drain regions. The set of data storage elements is correspondingly over and electrically coupled to the set of conductive patterns.

In some embodiments, a method comprises forming, over a continuous active region of a substrate, transistors having a set of common source/drain regions between first and second source/drain regions. The method further comprises sequentially depositing a first conductive material, a data storage material, and a second conductive material over the set of common source/drain regions, and patterning the deposited first conductive material, data storage material, and second conductive material to obtain a set of data storage elements. The method further comprises performing a damascene process, which comprises depositing a dielectric layer over a substrate, patterning the dielectric layer to obtain a damascene structure having via holes and recessed features over the via holes, and filing a conductive material into the via holes and the recessed features of the damascene structure, to correspondingly obtain a source line coupling the first and second source/drain regions, a first bit line coupling some data storage elements in the set of data storage elements, and a second bit line coupling other data storage elements in the set of data storage elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a set of word lines;

a first set of bit lines and a second set of bit lines;

a first source line having first and second source line contacts;

first and second strings of transistors electrically coupled in parallel between the first and second source line contacts of the first source line, each word line in the set of word lines is electrically coupled to gates of a transistor in the first string and a corresponding transistor in the second string;

a first set of data storage elements electrically coupled between the first string of transistors and the first set of bit lines; and a second set of data storage elements electrically coupled between the second string of transistors and the second set of bit lines.

2. The memory device of claim 1, wherein at least one of a pair of adjacent data storage elements in the first set of data storage elements is electrically coupled to different bit lines in the first set of bit lines, or a pair of adjacent data storage elements in the second set of data storage elements is electrically coupled to different bit lines in the second set of bit lines.

3. The memory device of claim 1, wherein the first string of transistors comprises:

a first transistor having a terminal electrically coupled to the first source line contact, a second transistor having a terminal electrically coupled to the second source line contact, and a third transistor having a first common terminal with the first transistor, and a further terminal, and the first set of data storage elements comprises:

a first data storage element electrically coupled between the first common terminal and a first bit line in the first set of bit lines, and a second data storage element electrically coupled between the further terminal of the third transistor and a second bit line in the first set of bit lines.

4. The memory device of claim 3, wherein the further terminal of the third transistor is a second common terminal of the third transistor and the second transistor.

5. The memory device of claim 3, wherein the first string of transistors further comprises a fourth transistor, the further terminal of the third transistor is a second common terminal of the third transistor and the fourth transistor, the fourth transistor has a third common terminal with the second transistor, and the first set of data storage elements further comprises a third data storage element electrically coupled between the third common terminal and the first bit line.

6. The memory device of claim 3, wherein the first set of transistors further comprises a fourth transistor and fifth transistor, the further terminal of the third transistor is a second common terminal of the third transistor and the fourth transistor, the fourth transistor has a third common terminal with the fifth transistor, the fifth transistor has a fourth common terminal with the second transistor, and the first set of data storage elements further comprises:

a third data storage element electrically coupled between the third common terminal and one of the first and second bit lines, and a fourth data storage element electrically coupled between the fourth common terminal and the other of the first and second bit lines.

7. The memory device of claim 1, further comprising:

a second source line having third and fourth source line contacts; and a third string of transistors electrically coupled between the third and fourth source line contacts of the second source line, each word line in the set of word lines is further electrically coupled to a gate of a transistor in the third string; and a third set of data storage elements electrically coupled between the third string of transistors and the first set of bit lines.

8. The memory device of claim 7, wherein the first string of transistors comprises:

a first transistor having a terminal electrically coupled to the first source line contact, a second transistor having a first common terminal with the first transistor, and a third transistor having a second common terminal with the second transistor, the first set of data storage elements comprises:

a first data storage element electrically coupled between the first common terminal and a first bit line in the first set of bit lines, and a second data storage element electrically coupled between the second common terminal and a second bit line in the first set of bit lines, the third string of transistors comprises:

a fourth transistor having a terminal electrically coupled to the third source line contact, a fifth transistor having a third common terminal with the fourth transistor, and a sixth transistor having a fourth common terminal with the fifth transistor, and the third set of data storage elements comprises:

a third data storage element electrically coupled between the third common terminal and the first bit line in the first set of bit lines, and a fourth data storage element electrically coupled between the fourth common terminal and the second bit line in the first set of bit lines.

9. The memory device of claim 8, wherein gates of the first transistor and fourth transistor are electrically coupled to a first word line in the set of word lines, gates of the second transistor and fifth transistor are electrically coupled to a second word line in the set of word lines, and gates of the third transistor and sixth transistor are electrically coupled to a third word line in the set of word lines.

10. The memory device of claim 1, wherein each data storage element in the first or second set of data storage elements is a resistive random access memory (RRAM) element, a phase-change RAM (PCRAM) element, or a magneto-resistive RAM (MRAM) element.

11. An integrated circuit (IC) device, comprising:

a substrate;

an active region continuously extending along a first direction over the substrate;

a plurality of gate regions extending across the active region along a second direction transverse to the first direction, and dividing the active region into a plurality of source/drain regions, each gate region among the plurality of gate regions arranged between a corresponding pair of source/drain regions among the plurality of source/drain regions, the plurality of source/drain regions comprising:

first and second source/drain regions, and a set of source/drain regions between the first and second source/drain regions;

in a first metal layer over the plurality of gate regions, a plurality of conductive patterns comprising:

first and second conductive patterns correspondingly over and electrically coupled to the first and second source/drain regions, and a set of conductive patterns between the first and second conductive patterns, and correspondingly over and electrically coupled to the set of source/drain regions; and a set of data storage elements correspondingly over and electrically coupled to the set of conductive patterns.

12. The IC device of claim 11, wherein the first and second conductive patterns are electrically coupled to each other.

13. The IC device of claim 11, further comprising:

in a second metal layer over the set of data storage elements, a set of bit lines electrically coupled correspondingly to the set of data storage elements.

14. The IC device of claim 13, wherein the set of bit lines comprises a first bit line and a second bit line, and in the set of data storage elements, one or more data storage elements electrically coupled to the first bit line and one or more data storage elements electrically coupled to the second bit line are arranged alternatingly along the first direction.

15. The IC device of claim 13, wherein the set of bit lines comprises a first bit line and a second bit line, and at least one of the first bit line or the second bit line is electrically coupled to more than one data storage elements in the set of data storage elements.

16. The IC device of claim 11, wherein the set of data storage elements includes two, three or four data storage elements.

17. The IC device of claim 11, wherein each data storage element in the set of data storage elements comprises:

a bottom electrode over and electrically coupled to a corresponding conductive pattern in the set of conductive patterns, a top electrode, and a data storage material between the bottom electrode and the top electrode.

18. The IC device of claim 17, further comprising:

in a second metal layer over the set of data storage elements, a set of bit lines correspondingly over the set of data storage elements, wherein the set of bit lines comprises:

a first bit line electrically coupled to the top electrodes of first and second data storage elements in the set of data storage elements, and a second bit line electrically coupled to the top electrodes of third and fourth data storage elements in the set of data storage elements, and the first and second conductive patterns are electrically coupled to each other.

19. The IC device of claim 18, wherein along the first direction, the second data storage element is arranged between the first and third data storage elements, and the third data storage element is arranged between the second and fourth data storage elements.

20. A method, comprising:

forming, over a continuous active region of a substrate, transistors having a set of common source/drain regions between first and second source/drain regions;

sequentially depositing a first conductive material, a data storage material, and a second conductive material over the set of common source/drain regions, and patterning the deposited first conductive material, data storage material, and second conductive material to obtain a set of data storage elements; and performing a damascene process, which comprises depositing a dielectric layer over a substrate, patterning the dielectric layer to obtain a damascene structure having via holes and recessed features over the via holes, and filing a conductive material into the via holes and the recessed features of the damascene structure, to correspondingly obtain a source line coupling the first and second source/drain regions, a first bit line coupling some data storage elements in the set of data storage elements, and a second bit line coupling other data storage elements in the set of data storage elements.

* * * * *